(12) United States Patent
Hebiguchi et al.

(10) Patent No.: US 9,400,315 B2
(45) Date of Patent: Jul. 26, 2016

(54) CURRENT SENSOR

(71) Applicant: ALPS GREEN DEVICES CO., LTD., Tokyo (JP)

(72) Inventors: Hiroyuki Hebiguchi, Miyagi-ken (JP); Isao Sato, Miyagi-ken (JP); Takashi Fujisaki, Miyagi-ken (JP); Mitsuo Aratono, Miyagi-ken (JP); Akira Takahashi, Miyagi-ken (JP); Masato Nakamura, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 383 days.

(21) Appl. No.: 13/951,278

(22) Filed: Jul. 25, 2013

(65) Prior Publication Data

US 2013/0307534 A1 Nov. 21, 2013

Related U.S. Application Data

(63) Continuation of application No. PCT/JP2012/053324, filed on Feb. 14, 2012.

(30) Foreign Application Priority Data

Mar. 2, 2011 (JP) ................. 2011-045475

(51) Int. Cl.
*G01R 33/09* (2006.01)
*G01R 33/02* (2006.01)
*H01L 43/08* (2006.01)
*G01R 33/00* (2006.01)
*G01R 33/06* (2006.01)
*G01R 15/20* (2006.01)

(52) U.S. Cl.
CPC .......... *G01R 33/0005* (2013.01); *G01R 15/205* (2013.01); *G01R 33/06* (2013.01); *H01L 43/08* (2013.01); *H01L 2924/30107* (2013.01)

(58) Field of Classification Search
CPC ................ H04L 43/08; H04L 2924/30107; G01R 33/06
USPC ........... 324/252, 244, 117 R; 320/162
See application file for complete search history.

(56) References Cited

U.S. PATENT DOCUMENTS

| 6,642,705 | B2 * | 11/2003 | Kawase | 324/117 R |
|---|---|---|---|---|
| 7,723,984 | B2 * | 5/2010 | Shoji et al. | 324/252 |
| 8,847,588 | B2 * | 9/2014 | Tamura | 324/244 |
| 8,952,687 | B2 * | 2/2015 | Tamura | 324/244 |
| 2009/0121704 | A1 | 5/2009 | Shibahara | |

FOREIGN PATENT DOCUMENTS

| JP | 2001-305163 | 10/2001 |
|---|---|---|
| JP | 2009-162499 | 7/2009 |
| WO | WO 2006/090769 | 8/2006 |

OTHER PUBLICATIONS

Search Report dated May 15, 2012 from International Application No. PCT/JP2012/053324.

* cited by examiner

*Primary Examiner* — Reena Aurora
(74) *Attorney, Agent, or Firm* — Beyer Law Group LLP

(57) ABSTRACT

A current sensor includes first and second magnetic sensors that are placed around a current line through which a current flows so that the current line is positioned therebetween, and that detect an induction field generated by the current. Each of the first and second magnetic sensors has a main sensitivity axis and a sub-sensitivity axis. The direction of the main sensitivity axis of each of the first and second magnetic sensors is oriented in a direction that is not orthogonal to the direction of the induction field. The directions of the main sensitivity axes of the first and second magnetic sensors are oriented in the same direction and the directions of the sub-sensitivity axes are oriented in the same direction, or the directions of the main sensitivity axes are oriented in opposite directions and the directions of the sub-sensitivity axes are oriented in opposite directions.

19 Claims, 17 Drawing Sheets

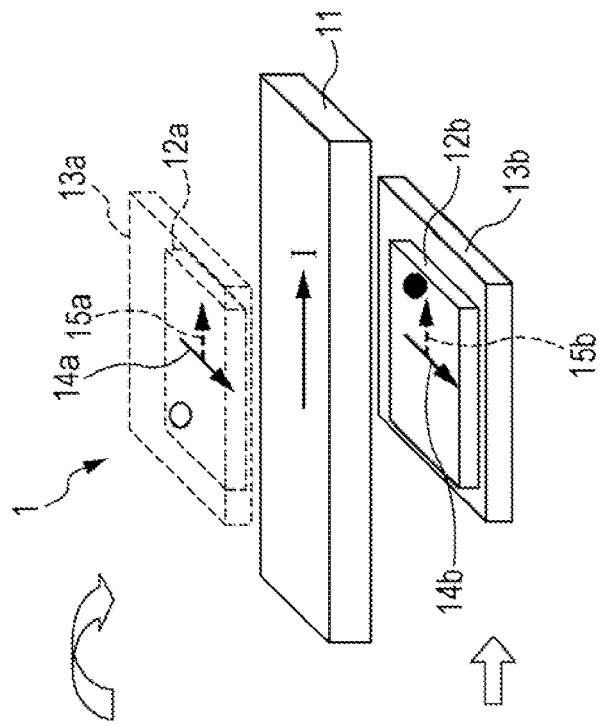
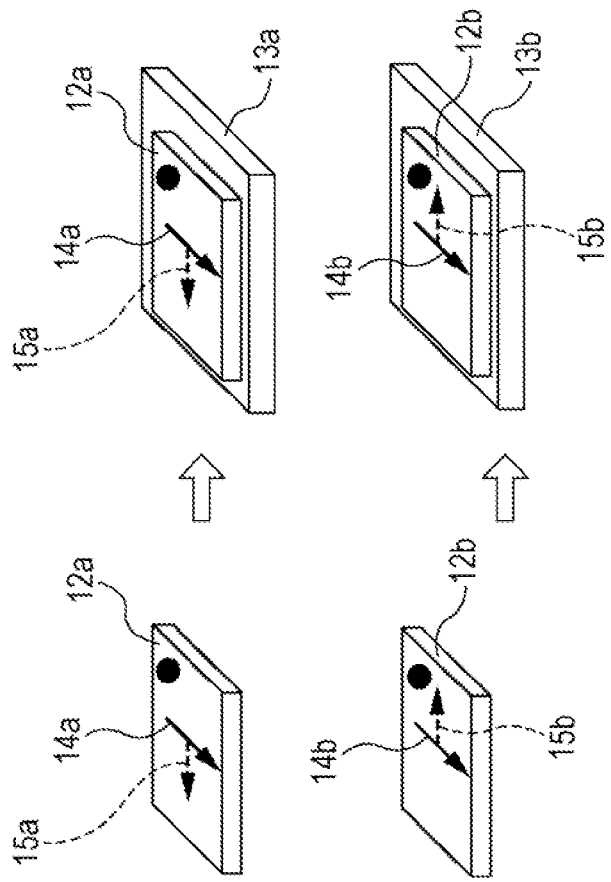
FIG. 3A    FIG. 3B    FIG. 3C

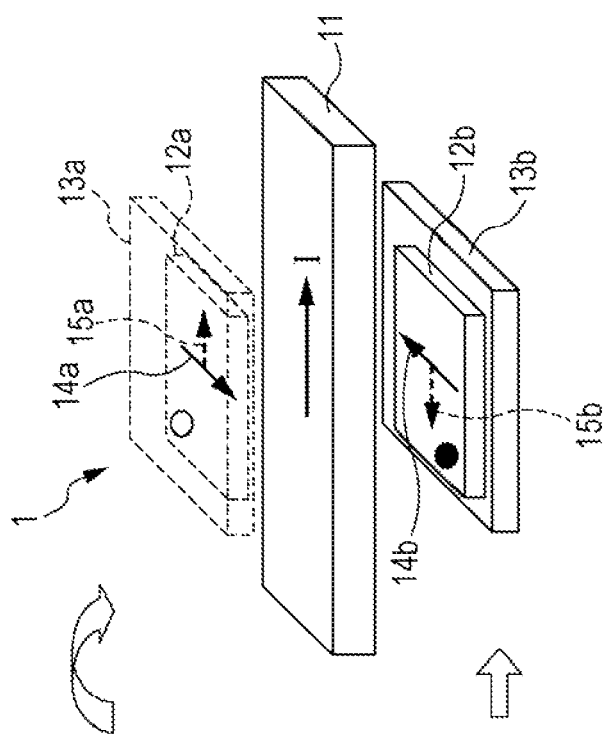
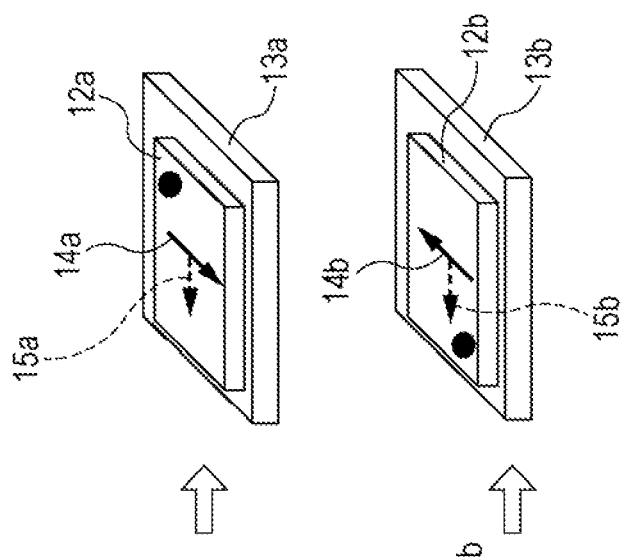
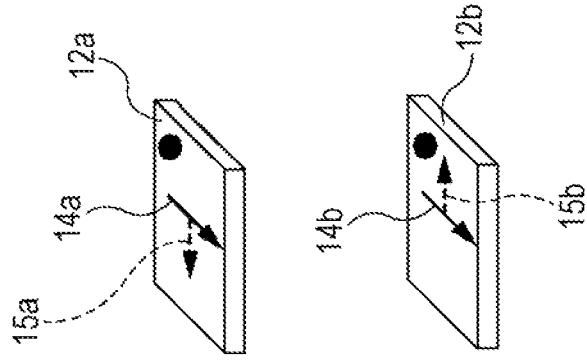

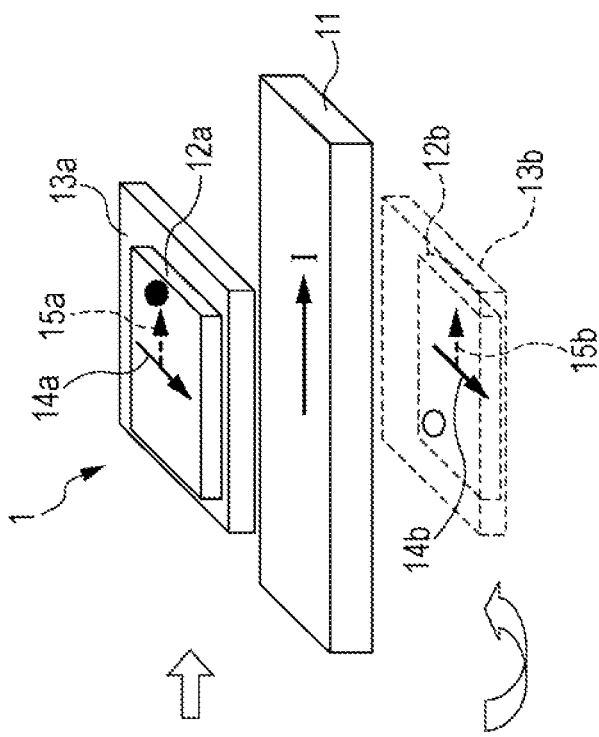

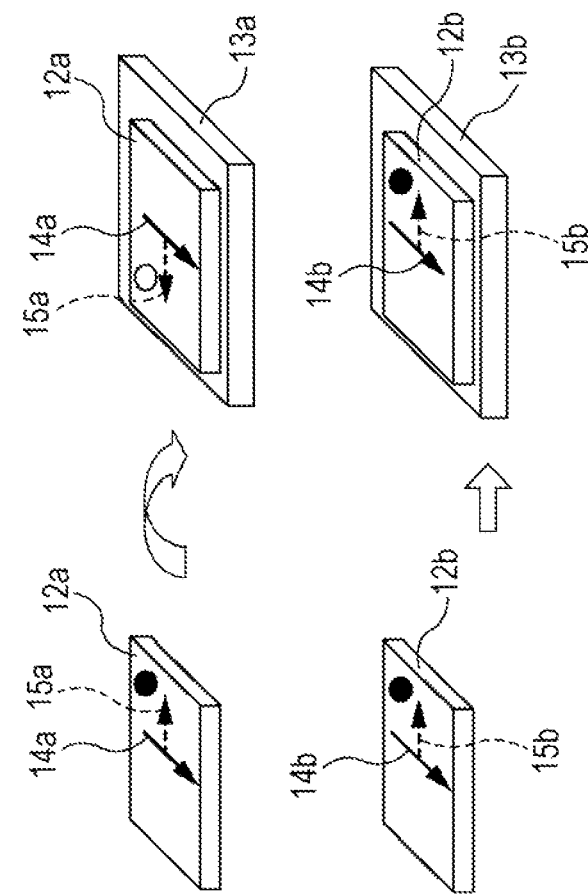

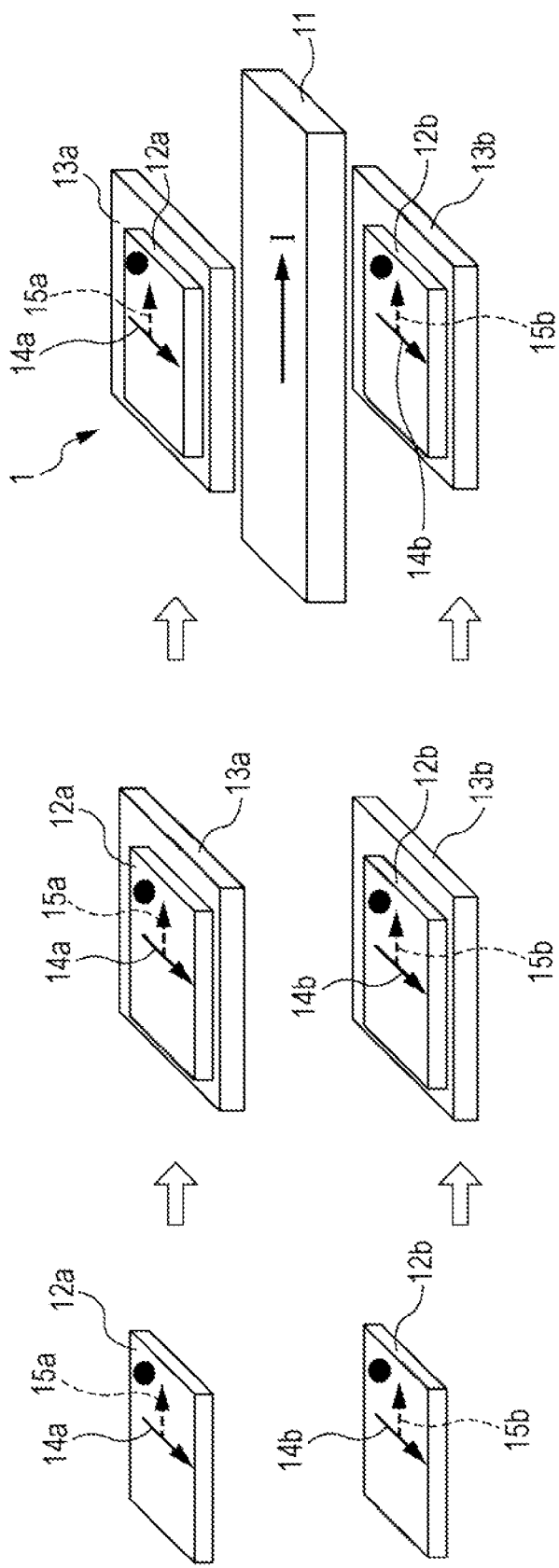

CURRENT SENSOR

CLAIM OF PRIORITY

This application is a Continuation of International Application No. PCT/JP2012/053324 filed on Feb. 14, 2012, which claims benefit of Japanese Patent Application No. 2011-045475 filed on Mar. 2, 2011. The entire contents of each application noted above are hereby incorporated by reference.

BACKGROUND OF THE INVENTION

1. Field of the Invention

The present invention relates to a current sensor that measures the magnitude of a current. More particularly, the present invention relates to a current sensor in which a reduction in the measurement accuracy due to disturbance magnetic fields is prevented.

2. Description of the Related Art

In the field of a motor driving technique or the like used in electric cars or hybrid cars, a comparatively large current is handled. Thus, for such an application, there has been a demand for a current sensor that can measure a large current in a noncontact manner. As such a current sensor, a current sensor using a scheme in which a change in a magnetic field generated by a measurement target current is detected using magnetic sensors has been put to practical use. Regarding the current sensor using magnetic sensors, a reduction in the measurement accuracy due to the influences of disturbance magnetic fields is a problem. Thus, a scheme for preventing a reduction in the measurement accuracy due to the influences of disturbance magnetic fields has been proposed.

As the scheme for preventing a reduction in the measurement accuracy due to the influences of disturbance magnetic fields, for example, a scheme has been proposed, in which the influences of disturbance magnetic fields are made to cancel each other out by providing magneto impedance (MI) elements in opposite directions for a magnetic field generated by a detection target current (see Japanese Unexamined Patent Application Publication No. 2001-305163).

As the magnetic sensors used in the above-described current sensor, in addition to the MI elements, giant magneto resistance (GMR) elements, Hall elements, or the like are used. In the case where GMR elements or the like are used in a current sensor, even when the technique described in Japanese Unexamined Patent Application Publication No. 2001-305163 is applied, marked reduction of the influences of disturbance magnetic fields may be impossible.

SUMMARY OF THE INVENTION

The present invention has been made in view of such issues, and provides a current sensor in which the influences of disturbance magnetic fields are reduced and in which a reduction in the accuracy with which a current is measured is prevented.

A current sensor according to the present invention includes a first magnetic sensor and a second magnetic sensor. The first magnetic sensor and the second magnetic sensor are placed around a current line through which a measurement target current flows, and detect an induction field generated by the measurement target current flowing through the current line. Each of the first magnetic sensor and the second magnetic sensor has a main sensitivity axis in a direction and a sub-sensitivity axis in a direction orthogonal to the direction of the main sensitivity axis. The first magnetic sensor and the second magnetic sensor are placed so that the current line is positioned therebetween. The first magnetic sensor and the second magnetic sensor are placed so that the direction of the main sensitivity axis of the first magnetic sensor is oriented in a direction that is not orthogonal to a direction of the induction field generated by the measurement target current flowing through the current line and the main sensitivity axis of the second magnetic sensor is oriented in a direction that is not orthogonal to the direction of the induction field generated by the measurement target current flowing through the current line. The first magnetic sensor and the second magnetic sensor are placed so that the directions of the main sensitivity axes of the first magnetic sensor and the second magnetic sensor are oriented in the same direction and the directions of the sub-sensitivity axes of the first magnetic sensor and the second magnetic sensor are oriented in the same direction, or placed so that the directions of the main sensitivity axes of the first magnetic sensor and the second magnetic sensor are oriented in opposite directions and the directions of the sub-sensitivity axes of the first magnetic sensor and the second magnetic sensor are oriented in opposite directions.

With this configuration, the directions of the individual main sensitivity axes of the first magnetic sensor and the second magnetic sensor are oriented in the same direction, and the directions of the individual sub-sensitivity axes of the first magnetic sensor and the second magnetic sensor are oriented in the same direction. Thus, the influences of disturbance magnetic fields appear equally in the output of the first magnetic sensor and the output of the second magnetic sensor. Therefore, by calculating the difference between the output of the first magnetic sensor and the output of the second magnetic sensor, the influences of disturbance magnetic fields can be markedly reduced, and a reduction in the accuracy with which a current is measured can be prevented. Alternatively, the directions of the individual main sensitivity axes of the first magnetic sensor and the second magnetic sensor are oriented in opposite directions, and the directions of the individual sub-sensitivity axes of the first magnetic sensor and the second magnetic sensor are oriented in opposite directions. Thus, the influences of disturbance magnetic fields appear oppositely in the output of the first magnetic sensor and the output of the second magnetic sensor. Therefore, by calculating the sum of the output of the first magnetic sensor and the output of the second magnetic sensor, the influences of disturbance magnetic fields can be markedly reduced, and a reduction in the accuracy with which a current is measured can be prevented.

In the current sensor according to the present invention, the directions of the main sensitivity axes of the first magnetic sensor and the second magnetic sensor may be oriented in the same direction. The current sensor may further include a computing device that calculates a difference between an output of the first magnetic sensor and an output of the second magnetic sensor.

In the current sensor according to the present invention, the directions of the main sensitivity axes of the first magnetic sensor and the second magnetic sensor may be oriented in opposite directions. The current sensor may further include a computing device that calculates a sum of an output of the first magnetic sensor and an output of the second magnetic sensor.

The current sensor according to the present invention may further include a first circuit board having a placement surface on which the first magnetic sensor is placed and a second circuit board having a placement surface on which the second magnetic sensor is placed. The first circuit board and the second circuit board may be placed so that the placement surface of the first circuit board and the placement surface of the second circuit board face each other and the current line is positioned between the placement surface of the first circuit board and the placement surface of the second circuit board.

With this configuration, the first magnetic sensor and the second magnetic sensor are symmetrically placed with respect to the current line. Thus, the distance between the current line and the first magnetic sensor and the distance between the current line and the second magnetic sensor are easily made equal. Therefore, the accuracy with which a current is measured can be markedly increased. Furthermore, because no circuit board is present between the current line and the first magnetic sensor and between the current line and the second magnetic sensor, the distance between the current line and the first magnetic sensor and the distance between the current line and the second magnetic sensor can be reduced. Therefore, the outputs of the magnetic sensors can be increased, and the accuracy with which a current is measured can be markedly increased.

The current sensor according to the present invention may further include a first circuit board having a placement surface on which the first magnetic sensor is placed and a second circuit board having a placement surface on which the second magnetic sensor is placed. The first circuit board and the second circuit board may be placed so that a surface of the first circuit board on a side opposite a side on which the placement surface of the first circuit board is positioned and a surface of the second circuit board on a side opposite a side on which the placement surface of the second circuit board is positioned face each other and the current line is positioned between the surface of the first circuit board and the surface of the second circuit board.

With this configuration, the first magnetic sensor and the second magnetic sensor are symmetrically placed with respect to the current line. Thus, the distance between the current line and the first magnetic sensor and the distance between the current line and the second magnetic sensor are easily made equal. Therefore, the accuracy with which a current is measured can be markedly increased.

In the current sensor according to the present invention, the direction of the main sensitivity axis and the direction of the sub-sensitivity axis of the first magnetic sensor and the direction of the main sensitivity axis and the direction of the sub-sensitivity axis of the second magnetic sensor may have a mirror-image relationship.

In the current sensor according to the present invention, when the first magnetic sensor and the second magnetic sensor are viewed from front-surface sides thereof, an angle defined by the direction of the main sensitivity axis and the direction of the sub-sensitivity axis of the first magnetic sensor and an angle defined by the direction of the main sensitivity axis and the direction of the sub-sensitivity axis of the second magnetic sensor may be equal. The first magnetic sensor may be placed on the first circuit board so that a front surface of the first magnetic sensor faces the placement surface of the first circuit board. The second magnetic sensor may be placed on the second circuit board so that a rear surface of the second magnetic sensor faces the placement surface of the second circuit board.

With this configuration, two magnetic sensors having the same configuration can be used. Thus, the influences of disturbance magnetic fields can be made to sufficiently cancel each other out, and a reduction in the accuracy with which a current is measured can be prevented.

The current sensor according to the present invention may further include a first circuit board having a placement surface on which the first magnetic sensor is placed and a second circuit board having a placement surface on which the second magnetic sensor is placed. The first circuit board and the second circuit board may be placed so that the placement surface of the first circuit board and a surface of the second circuit board on a side opposite a side on which the placement surface of the second circuit board is positioned face each other and the current line is positioned between the placement surface of the first circuit board and the surface of the second circuit board.

With this configuration, the implementation pattern of the first magnetic sensor for the first circuit board and the implementation pattern of the second magnetic sensor for the second circuit board are the same. Thus, a current sensor can be configured using circuit boards on which magnetic sensors are implemented in the same process. Therefore, the characteristics of the magnetic sensors and the circuit boards can be made to match at low cost.

In the current sensor according to the present invention, by placing a spacer between the current line and the first magnetic sensor or between the current line and the first circuit board, a distance between the current line and the first magnetic sensor and a distance between the current line and the second magnetic sensor may be made equal.

With this configuration, using the spacer, the distance between the current line and the first magnetic sensor and the distance between the current line and the second magnetic sensor are easily made equal. Therefore, the accuracy with which a current is measured can be markedly increased.

In the current sensor according to the present invention, the first magnetic sensor and the second magnetic sensor may be elements that have been produced using the same wafer and that have the same configuration.

With this configuration, two magnetic sensors in which the sensitivities along the main sensitivity axes or sub-sensitivity axes are the same can be used. Thus, the influences of disturbance magnetic fields can be made to sufficiently cancel each other out, and a reduction in the accuracy with which a current is measured can be prevented.

In the current sensor according to the present invention, the first magnetic sensor and the second magnetic sensor may be magnetic sensors using magnetoresistance effect elements. The direction of the sub-sensitivity axis of the first magnetic sensor and the direction of the sub-sensitivity axis of the second magnetic sensor may be directions of hard biases of magnetoresistance effect elements included in the first magnetic sensor and the second magnetic sensor.

With this configuration, the directions of the sub-sensitivity axes are controlled using the directions of the hard biases. Thus, the sensitivity characteristics in the directions of the sub-sensitivity axes of GMR elements match. Accordingly, the influences of disturbance magnetic fields that appear in the directions of the sub-sensitivity axes can be made to accurately cancel each other out.

In the current sensor according to the present invention, the first magnetic sensor and the second magnetic sensor may be magnetic sensors using Hall elements with magnetic flux concentrators.

In the current sensor according to the present invention, the direction of the main sensitivity axis of the first magnetic sensor may be oriented in a direction parallel to the direction of the induction field generated by the measurement target current flowing through the current line, and the direction of the main sensitivity axis of the second magnetic sensor may be oriented in a direction parallel to the direction of the induction field generated by the measurement target current flowing through the current line.

In the current sensor according to the present invention, the direction of the main sensitivity axis of the first magnetic sensor may be oriented in a direction that is not parallel to the direction of the induction field generated by the measurement target current flowing through the current line, and the direction of the main sensitivity axis of the second magnetic sensor may be oriented in a direction that is not parallel to the direction of the induction field generated by the measurement target current flowing through the current line.

BRIEF DESCRIPTION OF THE DRAWINGS

FIGS. 3A to 3C are schematic diagrams illustrating an example of a method for producing the current sensor according to the first embodiment;

FIGS. 6A to 6C are schematic diagrams illustrating an example of a method for producing the current sensor according to the second embodiment;

FIGS. 8A to 8C are schematic diagrams illustrating an example of a method for producing the current sensor according to the third embodiment;

FIGS. 10A to 10C are schematic diagrams illustrating an example of a method for producing the current sensor according to the fourth embodiment;

FIGS. 12A to 12C are schematic diagrams illustrating an example of a method for producing the current sensor according to the fifth embodiment;

DESCRIPTION OF THE PREFERRED EMBODIMENTS

The present inventors have found that, in a current sensor using magnetic sensors including GMR elements or the like, a factor that makes it impossible to markedly reduce the influences of disturbance magnetic fields is that each of the magnetic sensors has sensitivity in a direction orthogonal to the sensitivity axis thereof. For example, in a magnetic sensor using GMR elements, sensitivity in a direction orthogonal to the sensitivity axis thereof may be about several tens percent of sensitivity in the direction of the sensitivity axis. As described above, in the case where magnetic sensors, each of which also has sensitivity in a direction orthogonal to the sensitivity axis thereof, are used, it is impossible that, simply by orienting the directions of the sensitivity axes (hereinafter, referred to as the "directions of main sensitivity axes") of the magnetic sensors in the direction of an induction field, the influences of disturbance magnetic fields are sufficiently removed, even when the difference between the outputs of the magnetic sensors is calculated. The reason for this is that it is impossible that, simply by controlling the directions of the main sensitivity axes, the influences of disturbance magnetic fields which appear in directions orthogonal to the directions of the main sensitivity axes (hereinafter, referred to as the "directions of sub-sensitivity axes") are made to cancel each other out.

On the basis of such a finding, the present inventors have had an idea that, by controlling the directions of the sub-sensitivity axes of two magnetic sensors, the influences of disturbance magnetic fields which appear in the directions of the sub-sensitivity axes are made to cancel each other out. In other words, the gist of the present invention is that, in a type of current sensor in which the influences of disturbance magnetic fields are removed by performing computation (calculation of a difference or a sum) using the outputs of two magnetic sensors, the two magnetic sensors are placed so that the directions of the individual sub-sensitivity axes thereof are oriented in the same direction or so that the directions of the individual sub-sensitivity axes thereof are oriented in directions opposite to each other, thereby reducing the influences of disturbance magnetic fields and preventing a reduction in the accuracy with which a current is measured. Hereinafter, embodiments of the present invention will be described in detail with reference to the drawings.

First Embodiment

Figure 1A:
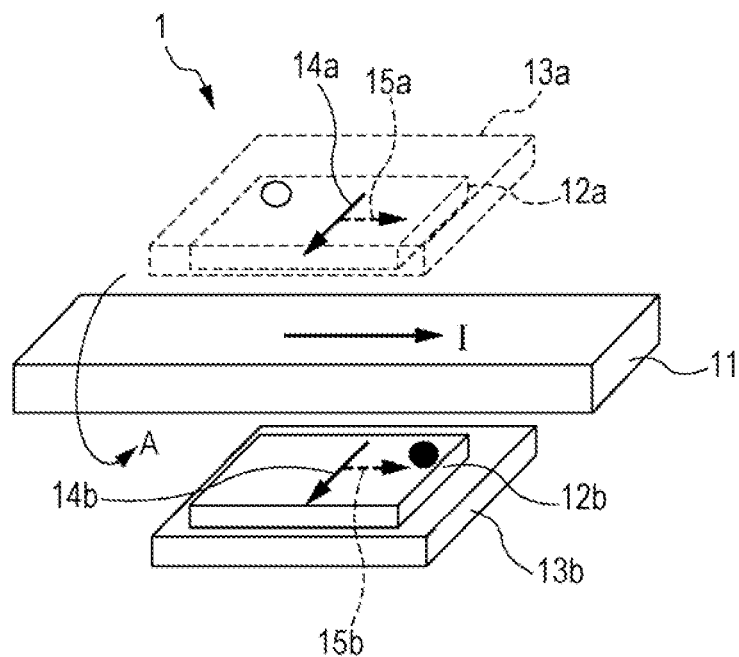
FIGS. 1A and 1B are schematic diagrams illustrating an example of a configuration of a current sensor according to a first embodiment.
Figure 1B:
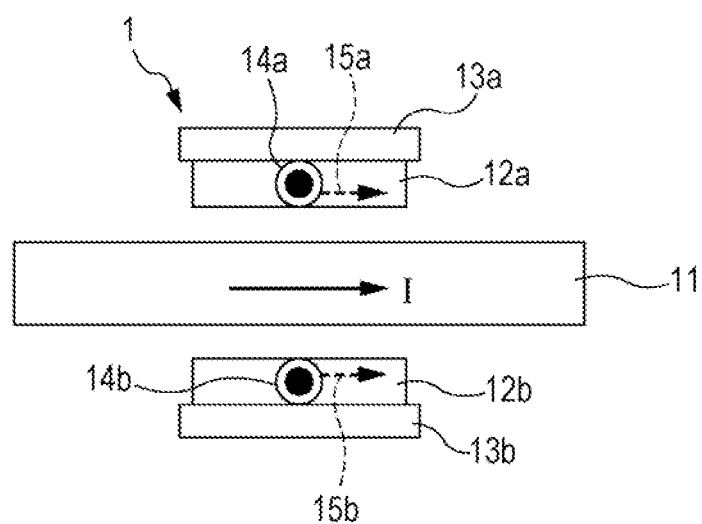

In a present embodiment, an example of a current sensor 1 according to the present invention will be described. FIGS. 1A and 1B are schematic diagrams illustrating the current sensor 1 according to the present embodiment. FIG. 1A is a perspective view schematically illustrating a configuration of the current sensor 1 and the surroundings thereof, and FIG. 1B is a plan view of the current sensor 1 when the current sensor 1 is viewed from the lower left of the page (the front) in FIG. 1A. Hereinafter, in a perspective view, the lower left of the page is referred to as the front, the upper right of the page is referred to as the rear, the left of the page is referred to as the left, the right of the page is referred to as the right, the top of the page is referred to as the top, and the bottom of the page is referred to as the bottom.

In FIGS. 1A and 1B, a solid-line arrow placed inside a current line 11 indicates the direction of a current flowing through the current line 11. In other words, in FIGS. 1A and 1B, the direction of a measurement target current I flowing through the current line 11 is the right direction. A solid-line arrow placed around the current line 11 indicates the direction of an induction field A generated by the measurement target current I. Furthermore, in FIGS. 1A and 1B, each of solid-line arrows 14a and 14b placed inside a first magnetic sensor 12a and a second magnetic sensor 12b indicates the direction of a main sensitivity axis of a corresponding one of the first magnetic sensor 12a and the second magnetic sensor 12b, and each of broken-line arrows 15a and 15b indicates the direction of a sub-sensitivity axis of a corresponding one of the first magnetic sensor 12a and the second magnetic sensor 12b. Here, a "main sensitivity axis" is an axis that is oriented in a certain direction so that the sensitivity of a magnetic sensor is the highest, and a "sub-sensitivity axis" is an axis that is oriented in a certain direction so that the sensitivity is the highest of those in directions orthogonal to the main sensitivity axis. Moreover, in order to easily distinguish the front surface and the rear surface from each other, circles are placed on the front surfaces of the first magnetic sensor 12a and the second magnetic sensor 12b. A black circle indicates that the front surface is oriented to the top, and a white circle indicates that the front surface is oriented to the bottom.

As illustrated in FIGS. 1A and 1B, the current sensor 1 includes the first magnetic sensor 12a and the second magnetic sensor 12b that are placed around the current line 11 through which the measurement target current I flows. Here, the current line 11 may be an element having any shape if the element can conduct electric charge as a current. Examples of the current line 11 include elements having a shape that is not a line shape, such as a plate conducive member and a thin-film conducive member (a conductive pattern). Note that the current line 11 is considered as an element that is not included in the current sensor 1.

In addition to the first magnetic sensor 12a and the second magnetic sensor 12b, the current sensor 1 includes a first circuit board 13a on which the first magnetic sensor 12a is placed, and a second circuit board 13b on which the second magnetic sensor 12b is placed. Moreover, the current sensor 1 further includes a computing device 16 (FIG. 2) that performs computation using the output of the first magnetic sensor 12a and the output of the second magnetic sensor 12b.

The first magnetic sensor 12a and the second magnetic sensor 12b are not particularly limited, if each of the first magnetic sensor 12a and the second magnetic sensor 12b is a magnetic sensor that can perform detection of magnetism, and that has a main sensitivity axis in a direction and a sub-sensitivity axis in a direction orthogonal to the direction of the main sensitivity axis. For example, in a magnetic sensor using magnetoresistance effect elements each having sensitivity that is smoothed using a hard bias, such as GMR elements or tunnel magneto resistance (TMR) elements, a sub-sensitivity axis is present. Furthermore, even in a Hall element, in the case where, using magnetic fluxes, the Hall element is made to have a magnetic-field sensitivity axis on a surface thereof, a sub-sensitivity axis is present. Therefore, GMR elements, TMR elements, or Hall elements with magnetic flux concentrators may be used in the first magnetic sensor 12a and the second magnetic sensor 12b.

In the current sensor 1 illustrated in FIGS. 1A and 1B, the first magnetic sensor 12a and the second magnetic sensor 12b are placed around the current line 11 so as to have outputs having almost opposite phases due to the induction field A generated by the measurement target current I flowing through the current line 11. For example, in FIGS. 1A and 1B, the first magnetic sensor 12a and the second magnetic sensor 12b are placed so that the current line 11 is positioned therebetween and the directions (the arrows 14a and 14b) of the main sensitivity axes of the first magnetic sensor 12a and the second magnetic sensor 12b are oriented in a direction perpendicular to a direction in which the current line 11 extends. More specifically, the first magnetic sensor 12a and the second magnetic sensor 12b are placed so that the direction (the arrow 14a) of the main sensitivity axis of the first magnetic sensor 12a is oriented in the direction of the induction field A generated by the measurement target current I flowing through the current line 11, the direction (the arrow 14b) of the main sensitivity axis of the second magnetic sensor 12b is oriented in the direction opposite to the direction of the induction field A generated by the measurement target current I flowing through the current line 11, and the directions of the individual main sensitivity axes of the first magnetic sensor 12a and the second magnetic sensor 12b are oriented in the same direction. Moreover, the first magnetic sensor 12a and the second magnetic sensor 12b are placed so that the directions (the arrows 15a and 15b) of the individual sub-sensitivity axes thereof are oriented in the same direction. Additionally, the first magnetic sensor 12a and the second magnetic sensor 12b are placed so that the front surfaces thereof are oriented to the current line 11.

In the current sensor 1 illustrated in FIGS. 1A and 1B, the direction of the main sensitivity axis of one of the first magnetic sensor 12a and the second magnetic sensor 12b is oriented in the direction of the induction field A generated by the measurement target current I flowing through the current line 11, and the direction of the main sensitivity axis of the other magnetic sensor is oriented in the direction opposite to the direction of the induction field A generated by the measurement target current I flowing through the current line 11. Thus, the influence of the induction field A appears as output signals of the first magnetic sensor 12a and the second magnetic sensor 12b that are signals having almost opposite phases. Furthermore, the directions of the individual main sensitivity axes of the first magnetic sensor 12a and the second magnetic sensor 12b are oriented in the same direction, and the directions of the individual sub-sensitivity axes of the first magnetic sensor 12a and the second magnetic sensor 12b are oriented in the same direction. Thus, the influences of disturbance magnetic fields appear equally in the output of the first magnetic sensor 12a and the output of the second magnetic sensor 12b. Therefore, by calculating the difference between the output of the first magnetic sensor 12a and the output of the second magnetic sensor 12b, the influences of disturbance magnetic fields can be markedly reduced, and a reduction in the accuracy with which a current is measured can be prevented. Note that output signals having almost opposite phases are output signals from which noise elements and so forth have been removed, and one of the output signals is an inverted signal of the other output signal. However, because it is only necessary that a current can be measured with a desired accuracy, it is not necessary that one of the output signals be a strictly inverted signal of the other output signal so that the corresponding values of the output signals have opposite signs.

Moreover, in the current sensor 1 illustrated in FIGS. 1A and 1B, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. In other words, when the first magnetic sensor 12a and the second magnetic sensor 12b are viewed from the front-surface sides thereof, with respect to the directions of the individual main sensitivity axes, the direction of the sub-sensitivity axis of the first magnetic sensor 12a and the direction of the sub-sensitivity axis of the second magnetic sensor 12b are opposite to each other.

Figure 2:
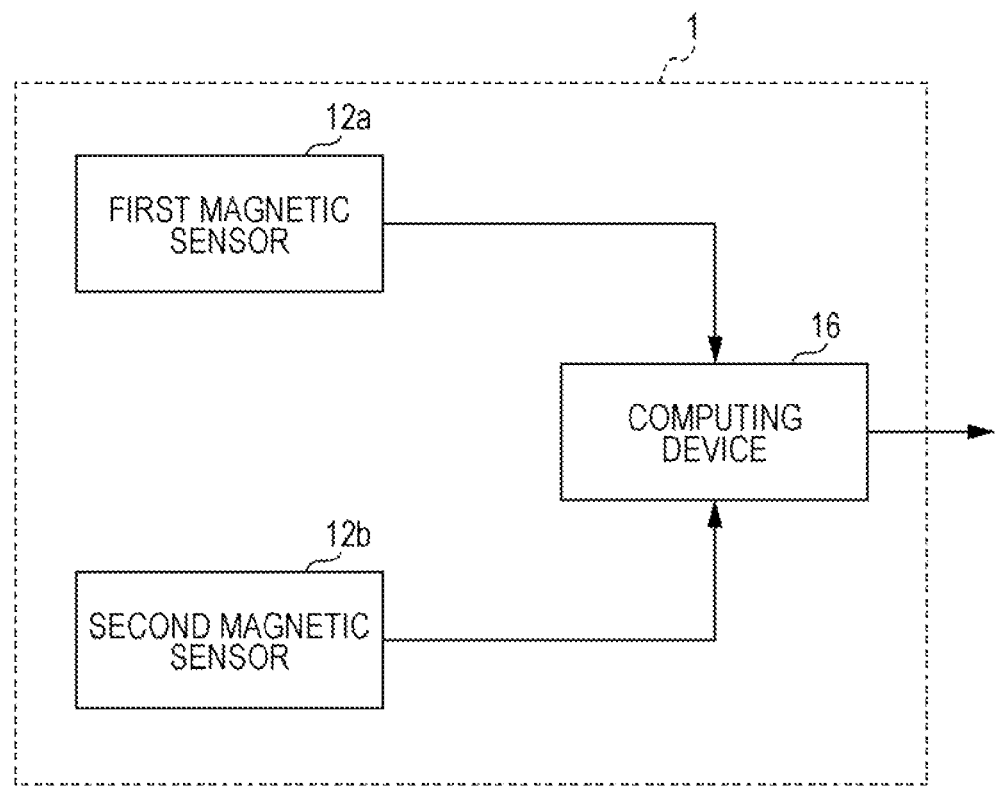
FIG. 2 is a block diagram illustrating an example of a circuit configuration of the current sensor according to the first embodiment.

FIG. 2 is a block diagram of a circuit configuration of the current sensor 1. As illustrated in FIG. 2, the current sensor 1 includes a computing device 16 that is connected to the output terminals of the first magnetic sensor 12a and the second magnetic sensor 12b. Here, the computing device 16 has a function of calculating the difference between the output of the first magnetic sensor 12a and the output of the second magnetic sensor 12b. Therefore, in the case where a current flows through the current line 11 and where an induction field is generated around the current line 11, when output signals corresponding to the current are output from the first magnetic sensor 12a and the second magnetic sensor 12b, the computing device 16 that has received the output signals can calculate and output the difference between the two output signals. As described above, by calculating the difference between the two output signals, the influences of disturbance magnetic fields can be made to cancel each other out, and the accuracy with which a current is measured can be increased. Note that the function of the computing device 16 may be realized by hardware, or may be realized by software.

FIGS. 3A to 3C are schematic diagrams illustrating an example of a method for producing the above-described current sensor 1. As illustrated in FIG. 3A, first, the first magnetic sensor 12a and the second magnetic sensor 12b are prepared. In FIG. 3A, the direction of the main sensitivity axis of the first magnetic sensor 12a is oriented to the front, and the direction of the sub-sensitivity axis thereof is oriented to the left. Furthermore, the direction of the main sensitivity axis of the second magnetic sensor 12b is oriented to the front, and the direction of the sub-sensitivity axis thereof is oriented to the right. In other words, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. Here, principal surfaces of the first magnetic sensor 12a and the second magnetic sensor 12b on the top sides (on the GMR-element sides) are considered as the front surfaces of the first magnetic sensor 12a and the second magnetic sensor 12b, respectively. Furthermore, principal surfaces of the first magnetic sensor 12a and the second magnetic sensor 12b on the bottom sides (on the board sides) are considered as the rear surfaces of the first magnetic sensor 12a and the second magnetic sensor 12b, respectively. Note that the relationship about the front surfaces and the rear surfaces may be reversed.

Next, as illustrated in FIG. 3B, the first magnetic sensor 12a is placed on a magnetic-sensor placement surface (hereinafter, referred to as a "placement surface") of the first circuit board 13a, and the second magnetic sensor 12b is placed on a placement surface of the second circuit board 13b. In other words, the first magnetic sensor 12a is placed so that the rear surface of the first magnetic sensor 12a and the placement surface of the first circuit board 13a face each other, and the second magnetic sensor 12b is placed so that the rear surface of the second magnetic sensor 12b and the placement surface of the second circuit board 13b face each other. Here, a placement surface (a magnetic-sensor placement surface) is a principal front surface which the first circuit board 13a or the second circuit board 13b has, and on which the first magnetic sensor 12a or the second magnetic sensor 12b is placed. Accordingly, as illustrated in FIG. 3B, when both the placement surface of the first circuit board 13a and the placement surface of the second circuit board 13b are oriented to the top and the directions (the arrows 14a and 14b) of the individual main sensitivity axes of the first magnetic sensor 12a and the second magnetic sensor 12b are oriented in the same direction, the directions (the arrows 15a and 15b) of the individual sub-sensitivity axes of the first magnetic sensor 12a and the second magnetic sensor 12b are oriented in directions opposite to each other.

After that, as illustrated in FIG. 3C, the first circuit board 13a and the second circuit board 13b are placed around the current line 11 so that the placement surface of the first circuit board 13a and the placement surface of the second circuit board 13b face each other and the current line 11 is positioned between the placement surface of the first circuit board 13a and the placement surface of the second circuit board 13b. Accordingly, the front surface of the first magnetic sensor 12a and the front surface of the second magnetic sensor 12b face each other, and the current line 11 is positioned between the front surface of the first magnetic sensor 12a and the front surface of the second magnetic sensor 12b. Such an arrangement can be realized, for example, by rotating a set of the first magnetic sensor 12a and the first circuit board 13a with respect to a set of the second magnetic sensor 12b and the second circuit board 13b.

In the current sensor 1 obtained using the method illustrated in FIGS. 3A to 3C, the first magnetic sensor 12a and the second magnetic sensor 12b are symmetrically placed with respect to the current line 11. Thus, the distance between the current line 11 and the first magnetic sensor 12a and the distance between the current line 11 and the second magnetic sensor 12b are easily made equal. Accordingly, because disturbance magnetic fields can be made to appropriately cancel each other out, the accuracy with which a current is measured can be markedly increased. Furthermore, because no circuit board is present between the current line 11 and the first magnetic sensor 12a and between the current line 11 and the second magnetic sensor 12b, the distance between the current line 11 and the first magnetic sensor 12a and the distance between the current line 11 and the second magnetic sensor 12b can be reduced. Therefore, the outputs of the magnetic sensors can be increased, and the accuracy with which a current is measured can be markedly increased.

Figure 4A:
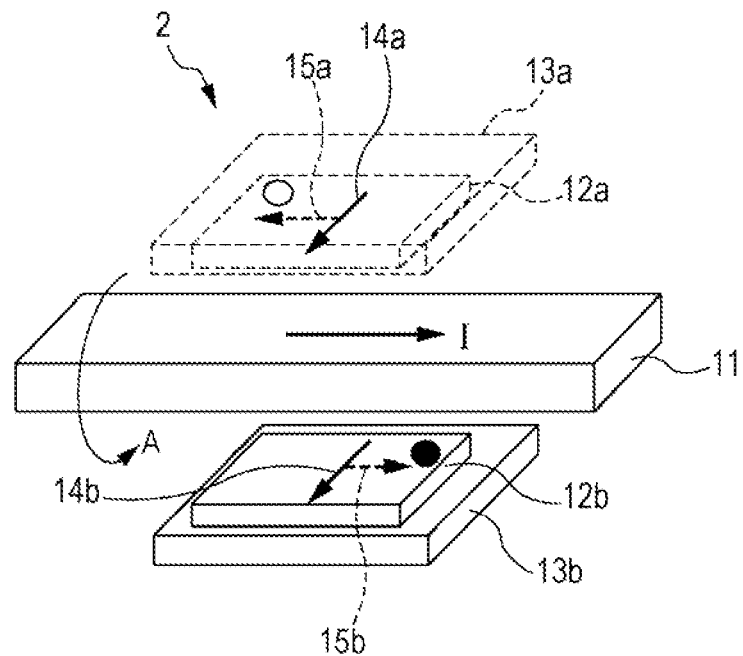
FIGS. 4A and 4B are schematic diagrams illustrating an example of a configuration of a current sensor of the related art.
Figure 4B:
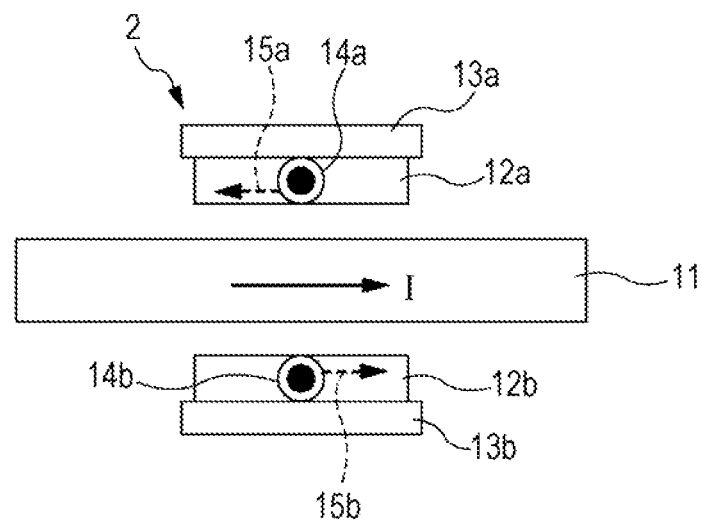

As described above, in the current sensor 1 according to the present embodiment, the influences of disturbance magnetic fields can be reduced, and a reduction in the accuracy with which a current is measured can be prevented, for example, compared with those in the case of a current sensor 2 illustrated in FIGS. 4A and 4B. The reason for this is that, in the current sensor 1 according to the present embodiment, the first magnetic sensor 12a and the second magnetic sensor 12b are placed in such a manner that the directions of the sub-sensitivity axes thereof are oriented in a certain direction so that disturbance magnetic fields can be made to appropriately cancel each other out.

Note that, in FIGS. 1A and 1B, a case where the direction of the main sensitivity axis of the first magnetic sensor 12a is oriented in the direction of the induction field generated by the current flowing through the current line 11 and where the direction of the main sensitivity axis of the second magnetic sensor 12b is oriented in the direction opposite to the direction of the induction field generated by the current flowing through the current line 11 is provided as an example. However, the configuration of the current sensor 1 according to the present embodiment is not limited thereto. The direction of the main sensitivity axis of the first magnetic sensor 12a may be oriented in the direction opposite to the direction of the induction field generated by the current flowing through the current line 11, and the direction of the main sensitivity axis of the second magnetic sensor 12b may be oriented in the direction of the induction field generated by the current flowing through the current line 11.

In addition, the present embodiment may be implemented by appropriately combining the configuration described in the present embodiment with a configuration described in another embodiment.

Second Embodiment

In a present embodiment, another example of the current sensor 1 according to the present invention will be described.

Figure 5A:
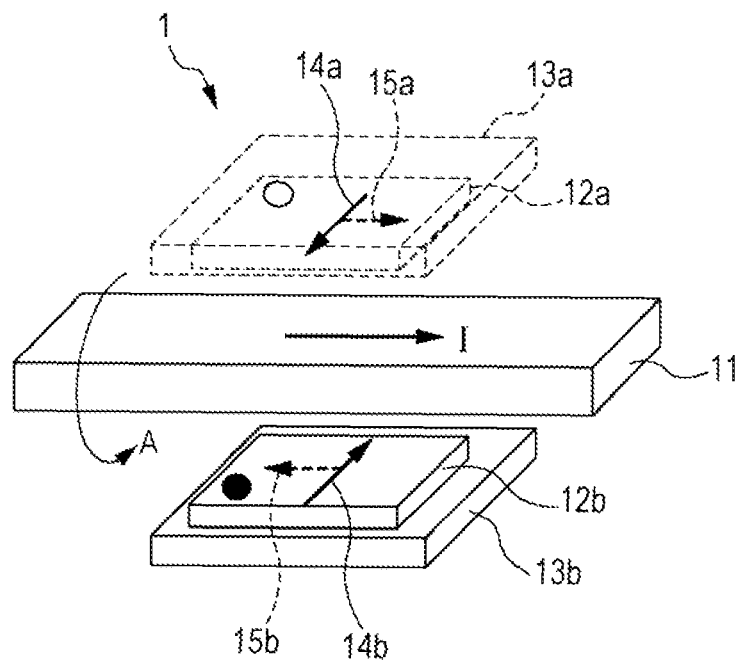
FIGS. 5A and 5B are schematic diagrams illustrating an example of a configuration of a current sensor according to a second embodiment.
Figure 5B:
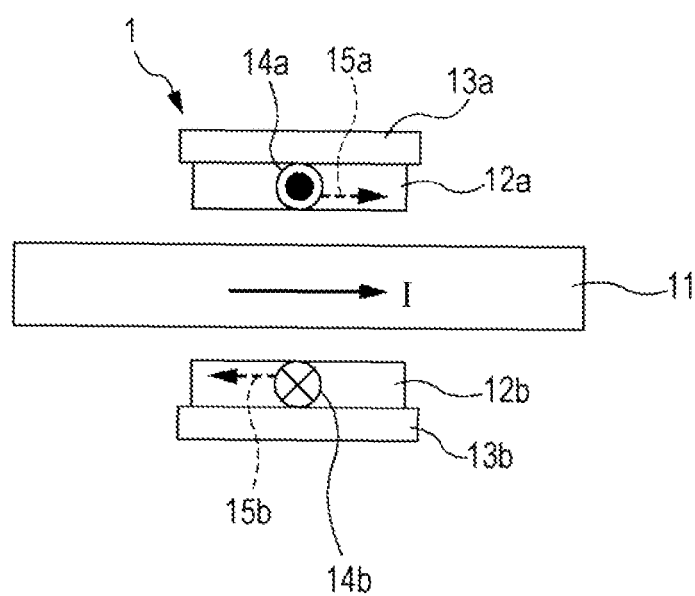

FIGS. 5A and 5B are schematic diagrams illustrating a current sensor 1 according to the present embodiment. FIG. 5A is a perspective view schematically illustrating a configuration of the current sensor 1 and the surroundings thereof, and FIG. 5B is a plan view of the current sensor 1 when the current sensor 1 is viewed from the lower left of the page (the front) in FIG. 5A.

As illustrated in FIGS. 5A and 5B, the current sensor 1 according to the present embodiment includes a first magnetic sensor 12a and a second magnetic sensor 12b that are placed around a current line 11, and further includes a first circuit board 13a on which the first magnetic sensor 12a is placed, and a second circuit board 13b on which the second magnetic sensor 12b is placed. Moreover, the current sensor 1 further includes a computing device that performs computation using the output of the first magnetic sensor 12a and the output of the second magnetic sensor 12b. In this regard, there is a commonality between the current sensor 1 illustrated in FIGS. 5A and 5B and the current sensor 1 illustrated in FIGS. 1A and 1B. The difference between the current sensor 1 illustrated in FIGS. 5A and 5B and the current sensor 1 illustrated in FIGS. 1A and 1B is the directions of the main sensitivity axes and the directions of the sub-sensitivity axes of the first magnetic sensor 12a and the second magnetic sensor 12b.

In the current sensor 1 illustrated in FIGS. 5A and 5B, the first magnetic sensor 12a and the second magnetic sensor 12b are placed around the current line 11 so as to have outputs having almost the same phase due to an induction field A generated by a measurement target current I flowing through the current line 11. More specifically, the first magnetic sensor 12a and the second magnetic sensor 12b are placed so that the direction (an arrow 14a) of the main sensitivity axis of the first magnetic sensor 12a is oriented in the direction of the induction field A generated by the measurement target current I flowing through the current line 11, the direction (an arrow 14b) of the main sensitivity axis of the second magnetic sensor 12b is oriented in the direction of the induction field A generated by the measurement target current I flowing through the current line 11, and the directions of the individual main sensitivity axes of the first magnetic sensor 12a and the second magnetic sensor 12b are oriented in opposite directions. Moreover, the first magnetic sensor 12a and the second magnetic sensor 12b are placed so that the directions (arrows 15a and 15b) of the individual sub-sensitivity axes thereof are oriented in directions opposite to each other. Additionally, the first magnetic sensor 12a and the second magnetic sensor 12b are placed so that the front surfaces thereof are oriented to the current line 11.

In the current sensor 1 having the configuration illustrated in FIGS. 5A and 5B, both of the directions of the individual main sensitivity axes of the first magnetic sensor 12a and the second magnetic sensor 12b are oriented in the direction of the induction field A generated by the measurement target current I flowing through the current line 11. Thus, the influence of the induction field A appears as output signals of the first magnetic sensor 12a and the second magnetic sensor 12b that are signals having almost the same phase. Furthermore, the directions of the individual main sensitivity axes of the first magnetic sensor 12a and the second magnetic sensor 12b are oriented in directions opposite to each other, and the directions of the individual sub-sensitivity axes of the first magnetic sensor 12a and the second magnetic sensor 12b are oriented in directions opposite to each other. Thus, the influences of disturbance magnetic fields appear oppositely in the output of the first magnetic sensor 12a and the output of the second magnetic sensor 12b. Therefore, by calculating the sum of the output of the first magnetic sensor 12a and the output of the second magnetic sensor 12b, the influences of disturbance magnetic fields can be markedly reduced, and a reduction in the accuracy with which a current is measured can be prevented. Note that the output signals having almost the same phase are similar output signals from which noise elements and so forth have been removed. However, because it is only necessary that a current can be measured with a desired accuracy, it is not necessary that the corresponding values of the output signals be strictly the same. Moreover, in the current sensor 1 illustrated in FIGS. 5A and 5B, the computing device has a function of calculating the sum of the output of the first magnetic sensor 12a and the output of the second magnetic sensor 12b.

Furthermore, in the current sensor 1 illustrated in FIGS. 5A and 5B, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. In other words, when the first magnetic sensor 12a and the second magnetic sensor 12b are viewed from the front-surface sides thereof, with respect to the directions of the individual main sensitivity axes, the direction of the sub-sensitivity axis of the first magnetic sensor 12a and the direction of the sub-sensitivity axis of the second magnetic sensor 12b are opposite to each other.

FIGS. 6A to 6C are schematic diagrams illustrating an example of a method for producing the current sensor 1 according to the present embodiment. As illustrated in FIG. 6A, first, the first magnetic sensor 12a and the second magnetic sensor 12b are prepared. In FIG. 6A, the direction of the main sensitivity axis of the first magnetic sensor 12a is oriented to the front, and the direction of the sub-sensitivity axis thereof is oriented to the left. Furthermore, the direction of the main sensitivity axis of the second magnetic sensor 12b is oriented to the front, and the direction of the sub-sensitivity axis thereof is oriented to the right. In other words, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. Here, principal surfaces of the first magnetic sensor 12a and the second magnetic sensor 12b on the top sides (on the GMR-element sides) are considered as the front surfaces of the first magnetic sensor 12a and the second magnetic sensor 12b, respectively. Furthermore, principal surfaces of the first magnetic sensor 12a and the second magnetic sensor 12b on the bottom sides (on the board sides) are considered as the rear surfaces of the first magnetic sensor 12a and the second magnetic sensor 12b, respectively. Note that the relationship about the front surfaces and the rear surfaces may be reversed.

Next, as illustrated in FIG. 6B, the first magnetic sensor 12a is placed on a placement surface of the first circuit board 13a, and the second magnetic sensor 12b is placed on a placement surface of the second circuit board 13b. In other words, the first magnetic sensor 12a is placed so that the rear surface of the first magnetic sensor 12a and the placement surface of the first circuit board 13a face each other, and the second magnetic sensor 12b is placed so that the rear surface of the second magnetic sensor 12b and the placement surface of the second circuit board 13b face each other. Accordingly, as illustrated in FIG. 6B, when both the placement surface of the first circuit board 13a and the placement surface of the second circuit board 13b are oriented to the top and the directions (the arrows 14a and 14b) of the individual main sensitivity axes of the first magnetic sensor 12a and the second magnetic sensor 12b are oriented in the same direction, the directions (the arrows 15a and 15b) of the individual sub-sensitivity axes of the first magnetic sensor 12a and the second magnetic sensor 12b are oriented in directions opposite to each other. Note that, in FIG. 6B, the second magnetic sensor 12b and the second circuit board 13b are illustrated in a state of being rotated by 180° in a plane including the placement surface of the second circuit board 13b.

After that, as illustrated in FIG. 6C, the first circuit board 13a and the second circuit board 13b are placed around the current line 11 so that the placement surface of the first circuit board 13a and the placement surface of the second circuit board 13b face each other and the current line 11 is positioned between the placement surface of the first circuit board 13a and the placement surface of the second circuit board 13b. Accordingly, the front surface of the first magnetic sensor 12a and the front surface of the second magnetic sensor 12b face each other, and the current line 11 is positioned between the front surface of the first magnetic sensor 12a and the front surface of the second magnetic sensor 12b. Such an arrangement can be realized, for example, by rotating a set of the first magnetic sensor 12a and the first circuit board 13a with respect to a set of the second magnetic sensor 12b and the second circuit board 13b.

In the current sensor 1 obtained using the method illustrated in FIGS. 6A to 6C, the first magnetic sensor 12a and the second magnetic sensor 12b are symmetrically placed with respect to the current line 11. Thus, the distance between the current line 11 and the first magnetic sensor 12a and the distance between the current line 11 and the second magnetic sensor 12b are easily made equal. Accordingly, because disturbance magnetic fields can be made to appropriately cancel each other out, the accuracy with which a current is measured can be markedly increased. Furthermore, because no circuit board is present between the current line 11 and the first magnetic sensor 12a and between the current line 11 and the second magnetic sensor 12b, the distance between the current line 11 and the first magnetic sensor 12a and the distance between the current line 11 and the second magnetic sensor 12b can be reduced. Therefore, the outputs of the magnetic sensors can be increased, and the accuracy with which a current is measured can be markedly increased.

As described above, in the current sensor 1 according to the present embodiment, the influences of disturbance magnetic fields can be reduced, and a reduction in the accuracy with which a current is measured can be prevented. The reason for this is that, in the current sensor 1 according to the present embodiment, the first magnetic sensor 12a and the second magnetic sensor 12b are placed in such a manner that the directions of the sub-sensitivity axes thereof are oriented in certain directions so that disturbance magnetic fields can be made to appropriately cancel each other out.

Note that, in FIGS. 5A and 5B and 6A to 6C, a case where both of the directions of the individual main sensitivity axes of the first magnetic sensor 12a and the second magnetic sensor 12b are oriented in the direction of the induction field A generated by the measurement target current I flowing through the current line 11 is provided as an example. However, the configuration of the current sensor 1 according to the present embodiment is not limited thereto. Both of the directions of the individual main sensitivity axes of the first magnetic sensor 12a and the second magnetic sensor 12b may be oriented in the direction opposite to the direction of the induction field A generated by the measurement target current I flowing through the current line 11.

In addition, the present embodiment may be implemented by appropriately combining the configuration described in the present embodiment with a configuration described in another embodiment.

Third Embodiment

Figure 7A:
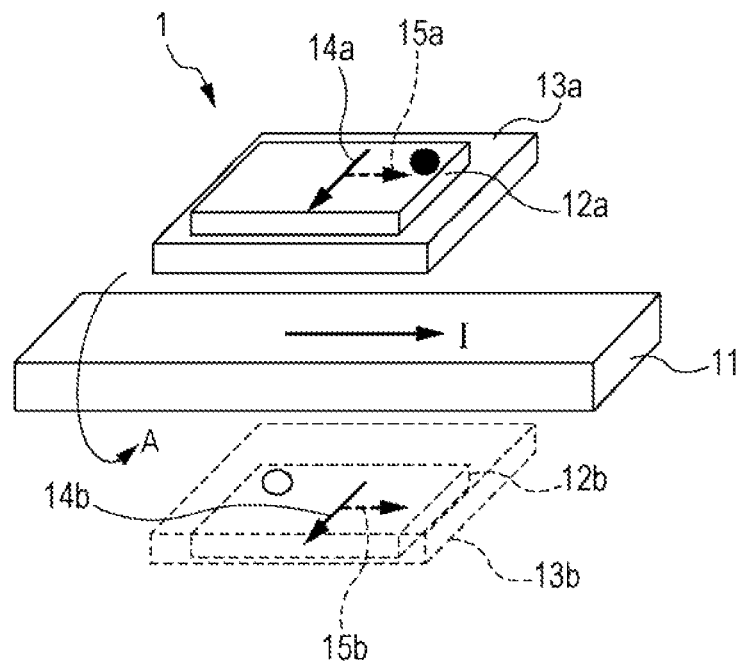
FIGS. 7A and 7B are schematic diagrams illustrating an example of a configuration of a current sensor according to a third embodiment.
Figure 7B:
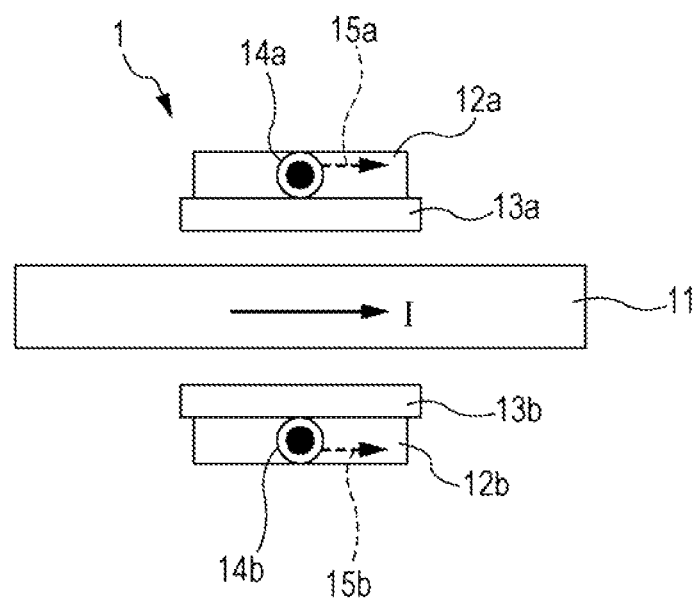

In a present embodiment, another example of the current sensor 1 according to the present invention will be described. FIGS. 7A and 7B are schematic diagrams illustrating a current sensor 1 according to the present embodiment. FIG. 7A is a perspective view schematically illustrating a configuration of the current sensor 1 and the surroundings thereof, and FIG. 7B is a plan view of the current sensor 1 when the current sensor 1 is viewed from the lower left of the page (the front) in FIG. 7A.

As illustrated in FIGS. 7A and 7B, the current sensor 1 according to the present embodiment includes a first magnetic sensor 12a and a second magnetic sensor 12b that are placed around a current line 11, and further includes a first circuit board 13a on which the first magnetic sensor 12a is placed, and a second circuit board 13b on which the second magnetic sensor 12b is placed. Moreover, the current sensor 1 further includes a computing device that performs computation using the output of the first magnetic sensor 12a and the output of the second magnetic sensor 12b. In this regard, there is a commonality between the current sensor 1 illustrated in FIGS. 7A and 7B and the current sensor 1 illustrated in FIGS. 1A and 1B. The difference between the current sensor 1 illustrated in FIGS. 7A and 7B and the current sensor 1 illustrated in FIGS. 1A and 1B is the positional relationship between the first magnetic sensor 12a and the second magnetic sensor 12b and the first circuit board 13a and the second circuit board 13b. In other words, in the current sensor 1 according to the present embodiment, the first circuit board 13a and the second circuit board 13b are placed so that a surface of the first circuit board 13a on a side opposite a side on which a placement surface of the first circuit board 13a is positioned and a surface of the second circuit board 13b on a side opposite a side on which a placement surface of the second circuit board 13b is positioned face each other and the current line 11 is positioned between the surface of the first circuit board 13a and the surface of the second circuit board 13b. The first circuit board 13a and the second circuit board 13b are placed so as to be closer to the current line 11 than the first magnetic sensor 12a and the second magnetic sensor 12b.

In the current sensor 1 illustrated in FIGS. 7A and 7B, the first magnetic sensor 12a and the second magnetic sensor 12b are placed around the current line 11 so as to have outputs having almost opposite phases due to an induction field generated by a current flowing through the current line 11. More specifically, the first magnetic sensor 12a and the second magnetic sensor 12b are placed so that the direction (an arrow 14a) of the main sensitivity axis of the first magnetic sensor 12a is oriented in the direction of an induction field A generated by a measurement target current I flowing through the current line 11, the direction (an arrow 14b) of the main sensitivity axis of the second magnetic sensor 12b is oriented in the direction opposite to the direction of the induction field A generated by the measurement target current I flowing through the current line 11, and the directions of the individual main sensitivity axes of the first magnetic sensor 12a and the second magnetic sensor 12b are oriented in the same direction. Moreover, the first magnetic sensor 12a and the second magnetic sensor 12b are placed so that the directions (arrows 15a and 15b) of the individual sub-sensitivity axes thereof are oriented in the same direction. Additionally, the first magnetic sensor 12a and the second magnetic sensor 12b are placed so that the rear surfaces thereof are oriented to the current line 11.

In the current sensor 1 having the configuration illustrated in FIGS. 7A and 7B, the direction of the main sensitivity axis of one of the first magnetic sensor 12a and the second magnetic sensor 12b is oriented in the direction of the induction field A generated by the measurement target current I flowing through the current line 11, and the direction of the main sensitivity axis of the other magnetic sensor is oriented in the direction opposite to the direction of the induction field A generated by the measurement target current I flowing through the current line 11. Thus, the influence of the induction field A appears as output signals of the first magnetic sensor 12a and the second magnetic sensor 12b that are signals having almost opposite phases. Furthermore, the directions of the individual main sensitivity axes of the first magnetic sensor 12a and the second magnetic sensor 12b are oriented in the same direction, and the directions of the individual sub-sensitivity axes of the first magnetic sensor 12a and the second magnetic sensor 12b are oriented in the same direction. Thus, the influences of disturbance magnetic fields appear equally in the output of the first magnetic sensor 12a and the output of the second magnetic sensor 12b. Therefore, by calculating the difference between the output of the first magnetic sensor 12a and the output of the second magnetic sensor 12b, the influences of disturbance magnetic fields can be markedly reduced, and a reduction in the accuracy with which a current is measured can be prevented.

Furthermore, in the current sensor 1 illustrated in FIGS. 7A and 7B, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. In other words, when the first magnetic sensor 12a and the second magnetic sensor 12b are viewed from the front-surface sides thereof, with respect to the directions of the individual main sensitivity axes, the direction of the sub-sensitivity axis of the first magnetic sensor 12a and the direction of the sub-sensitivity axis of the second magnetic sensor 12b are opposite to each other.

FIGS. 8A to 8C are schematic diagrams illustrating an example of a method for producing the current sensor 1 according to the present embodiment. As illustrated in FIG. 8A, first, the first magnetic sensor 12a and the second magnetic sensor 12b are prepared. In FIG. 8A, the direction of the main sensitivity axis of the first magnetic sensor 12a is oriented to the front, and the direction of the sub-sensitivity axis thereof is oriented to the right. Furthermore, the direction of the main sensitivity axis of the second magnetic sensor 12b is oriented to the front, and the direction of the sub-sensitivity axis thereof is oriented to the left. In other words, the direction of the main sensitivity axis and the direction of the sub-sensitivity axis of the first magnetic sensor 12a and the direction of the main sensitivity axis and the direction of the sub-sensitivity axis of the second magnetic sensor 12b have a mirror-image relationship. Here, principal surfaces of the first magnetic sensor 12a and the second magnetic sensor 12b on the top sides (on the GMR-element sides) are considered as the front surfaces of the first magnetic sensor 12a and the second magnetic sensor 12b, respectively. Furthermore, principal surfaces of the first magnetic sensor 12a and the second magnetic sensor 12b on the bottom sides (on the board sides) are considered as the rear surfaces of the first magnetic sensor 12a and the second magnetic sensor 12b, respectively. Note that the relationship about the front surfaces and the rear surfaces may be reversed.

Next, as illustrated in FIG. 8B, the first magnetic sensor 12a is placed on a placement surface of the first circuit board 13a, and the second magnetic sensor 12b is placed on a placement surface of the second circuit board 13b. In other words, the first magnetic sensor 12a is placed so that the rear surface of the first magnetic sensor 12a and the placement surface of the first circuit board 13a face each other, and the second magnetic sensor 12b is placed so that the rear surface of the second magnetic sensor 12b and the placement surface of the second circuit board 13b face each other. Accordingly, as illustrated in FIG. 8B, when both the placement surface of the first circuit board 13a and the placement surface of the second circuit board 13b are oriented to the top and the directions (the arrows 14a and 14b) of the individual main sensitivity axes of the first magnetic sensor 12a and the second magnetic sensor 12b are oriented in the same direction, the directions (the arrows 15a and 15b) of the individual sub-sensitivity axes of the first magnetic sensor 12a and the second magnetic sensor 12b are oriented in directions opposite to each other.

After that, as illustrated in FIG. 8C, the first circuit board 13a and the second circuit board 13b are placed around the current line 11 so that the surface of the first circuit board 13a on the side opposite the side on which the placement surface of the first circuit board 13a is positioned and the surface of the second circuit board 13b on the side opposite the side on which the placement surface of the second circuit board 13b is positioned face each other and the current line 11 is positioned between the surface of the first circuit board 13a and the surface of the second circuit board 13b. In other words, the first circuit board 13a and the second circuit board 13b are placed so as to be closer to the current line 11 than the first magnetic sensor 12a and the second magnetic sensor 12b. Such an arrangement can be realized, for example, by rotating a set of the second magnetic sensor 12b and the second circuit board 13b with respect to a set of the first magnetic sensor 12a and the first circuit board 13a.

In the current sensor 1 obtained using the method illustrated in FIGS. 8A to 8C, the first magnetic sensor 12a and the second magnetic sensor 12b are symmetrically placed with respect to the current line 11. Thus, the distance between the current line 11 and the first magnetic sensor 12a and the distance between the current line 11 and the second magnetic sensor 12b are easily made equal. Accordingly, because disturbance magnetic fields can be made to appropriately cancel each other out, the accuracy with which a current is measured can be markedly increased.

As described above, in the current sensor 1 according to the present embodiment, the influences of disturbance magnetic fields can be reduced, and a reduction in the accuracy with which a current is measured can be prevented. The reason for this is that, in the current sensor 1 according to the present embodiment, the first magnetic sensor 12a and the second magnetic sensor 12b are placed in such a manner that the directions of the sub-sensitivity axes thereof are oriented in a certain direction so that disturbance magnetic fields can be made to appropriately cancel each other out.

Note that, in FIGS. 7A and 7B and 8A to 8C, a case where the direction of the main sensitivity axis of the first magnetic sensor 12a is oriented in the direction of the induction field A generated by the measurement target current I flowing through the current line 11 and where the direction of the main sensitivity axis of the second magnetic sensor 12b is oriented in the direction opposite to the direction of the induction field A generated by the measurement target current I flowing through the current line 11 is provided as an example. However, the configuration of the current sensor 1 according to the present embodiment is not limited thereto. The direction of the main sensitivity axis of the first magnetic sensor 12a may be oriented in the direction opposite to the direction of the induction field A generated by the measurement target current I flowing through the current line 11, and the direction of the main sensitivity axis of the second magnetic sensor 12b may be oriented in the direction of the induction field A generated by the measurement target current I flowing through the current line 11.

Additionally, in FIGS. 7A and 7B and 8A to 8C, a configuration in which disturbance magnetic fields are made to cancel each other out by calculating the difference between the outputs is described. However, the configuration of the current sensor 1 according to the present embodiment is not limited thereto. A configuration in which disturbance magnetic fields are made to cancel each other out by calculating the sum of the outputs may be provided. In this case, both of the directions of the individual main sensitivity axes of the first magnetic sensor 12a and the second magnetic sensor 12b are oriented in the direction of the induction field A generated by the measurement target current I flowing through the current line 11 or oriented in the direction opposite to the direction of the induction field A, and the directions of the individual sub-sensitivity axes of the first magnetic sensor 12a and the second magnetic sensor 12b may be oriented in directions opposite to each other.

In addition, the present embodiment may be implemented by appropriately combining the configuration described in the present embodiment with a configuration described in another embodiment.

Fourth Embodiment

Figure 9A:
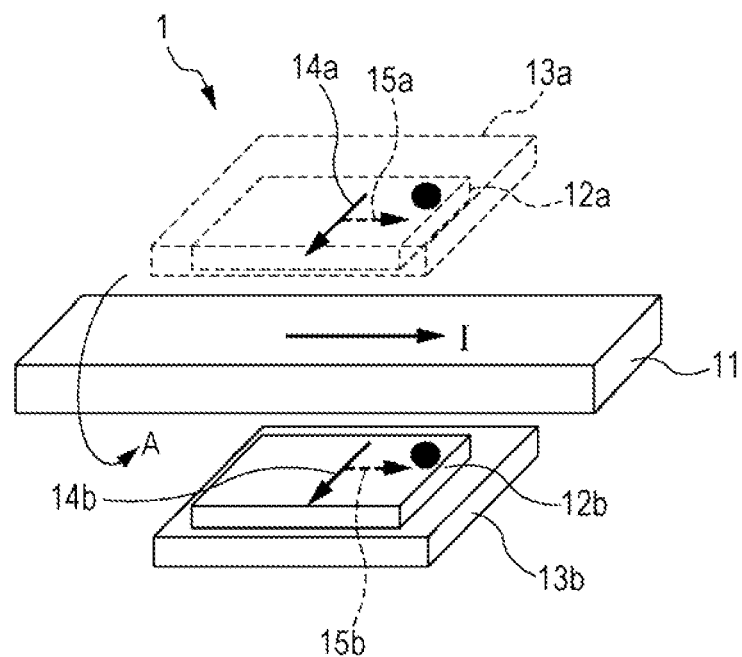
FIGS. 9A and 9B are schematic diagrams illustrating an example of a configuration of a current sensor according to a fourth embodiment.
Figure 9B:
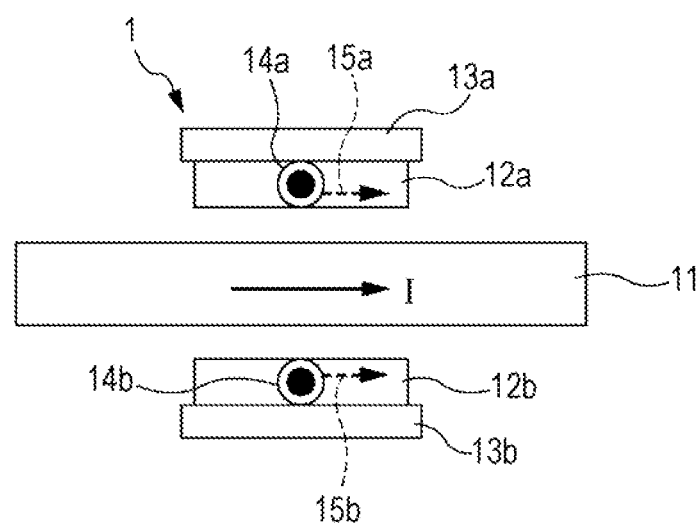

In a present embodiment, another example of the current sensor 1 according to the present invention will be described. FIGS. 9A and 9B are schematic diagrams illustrating a current sensor 1 according to the present embodiment. FIG. 9A is a perspective view schematically illustrating a configuration of the current sensor 1 and the surroundings thereof, and FIG. 9B is a plan view of the current sensor 1 when the current sensor 1 is viewed from the lower left of the page (the front) in FIG. 9A.

As illustrated in FIGS. 9A and 9B, the current sensor 1 according to the present embodiment includes a first magnetic sensor 12a and a second magnetic sensor 12b that are placed around a current line 11, and further includes a first circuit board 13a on which the first magnetic sensor 12a is placed, and a second circuit board 13b on which the second magnetic sensor 12b is placed. Moreover, the current sensor 1 further includes a computing device that performs computation using the output of the first magnetic sensor 12a and the output of the second magnetic sensor 12b. In this regard, there is a commonality between the current sensor 1 illustrated in FIGS. 9A and 9B and the current sensor 1 illustrated in FIGS. 1A and 1B. The difference between the current sensor 1 illustrated in FIGS. 9A and 9B and the current sensor 1 illustrated in FIGS. 1A and 1B is the positional relationship between the first magnetic sensor 12a and the second magnetic sensor 12b and the first circuit board 13a and the second circuit board 13b. In other words, in the current sensor 1 according to the present embodiment, the first magnetic sensor 12a and the first circuit board 13a are placed so that the front surface of the first magnetic sensor 12a faces a placement surface of the first circuit board 13a, and the second magnetic sensor 12b and the second circuit board 13b are placed so that the rear surface of the second magnetic sensor 12b faces a placement surface of the second circuit board 13b. Furthermore, magnetic sensors having the same configuration are used as the first magnetic sensor 12a and the second magnetic sensor 12b. Accordingly, when the first magnetic sensor 12a and the second magnetic sensor 12b are viewed from the front-surface sides thereof, an angle defined by the direction of the main sensitivity axis and the direction of the sub-sensitivity axis of the first magnetic sensor 12a and an angle defined by the direction of the main sensitivity axis and the direction of the sub-sensitivity axis of the second magnetic sensor 12b are almost equal. Here, preferably, the first magnetic sensor 12a and the second magnetic sensor 12b include elements which have been produced using the same wafer and which have the same configuration. In such magnetic sensors, because the sensitivities along the main sensitivity axes or sub-sensitivity axes can be the same, the influences of disturbance magnetic fields can be made to easily cancel each other out.

In the current sensor 1 illustrated in FIGS. 9A and 9B, the first magnetic sensor 12a and the second magnetic sensor 12b are placed around the current line 11 so as to have outputs having almost opposite phases due to an induction field A generated by a measurement target current I flowing through the current line 11. More specifically, the first magnetic sensor 12a and the second magnetic sensor 12b are placed so that the direction (an arrow 14a) of the main sensitivity axis of the first magnetic sensor 12a is oriented in the direction of the induction field A generated by the measurement target current I flowing through the current line 11, the direction (an arrow 14b) of the main sensitivity axis of the second magnetic sensor 12b is oriented in the direction opposite to the direction of the induction field A generated by the measurement target current I flowing through the current line 11, and the directions of the individual main sensitivity axes of the first magnetic sensor 12a and the second magnetic sensor 12b are oriented in the same direction. Moreover, the first magnetic sensor 12a and the second magnetic sensor 12b are placed so that the directions (arrows 15a and 15b) of the individual sub-sensitivity axes thereof are oriented in the same direction. Additionally, the first magnetic sensor 12a is placed so that the rear surface thereof is oriented to the current line 11, and the second magnetic sensor 12b are placed so that the front surface thereof is oriented to the current line 11.

In the current sensor 1 having the configuration illustrated in FIGS. 9A and 9B, the direction of the main sensitivity axis of one of the first magnetic sensor 12a and the second magnetic sensor 12b is oriented in the direction of the induction field A generated by the measurement target current I flowing through the current line 11, and the direction of the main sensitivity axis of the other magnetic sensor is oriented in the direction opposite to the direction of the induction field A generated by the measurement target current I flowing through the current line 11. Thus, the influence of the induction field A appears as output signals of the first magnetic sensor 12a and the second magnetic sensor 12b that are signals having almost opposite phases. Furthermore, the directions of the individual main sensitivity axes of the first magnetic sensor 12a and the second magnetic sensor 12b are oriented in the same direction, and the directions of the individual sub-sensitivity axes of the first magnetic sensor 12a and the second magnetic sensor 12b are oriented in the same direction. Thus, the influences of disturbance magnetic fields appear equally in the output of the first magnetic sensor 12a and the output of the second magnetic sensor 12b. Therefore, by calculating the difference between the output of the first magnetic sensor 12a and the output of the second magnetic sensor 12b, the influences of disturbance magnetic fields can be markedly reduced, and a reduction in the accuracy with which a current is measured can be prevented.

FIGS. 10A to 10C are schematic diagrams illustrating an example of a method for producing the current sensor 1 according to the present embodiment. As illustrated in FIG. 10A, first, the first magnetic sensor 12a and the second magnetic sensor 12b are prepared. In FIG. 10A, the direction of the main sensitivity axis of the first magnetic sensor 12a is oriented to the front, and the direction of the sub-sensitivity axis thereof is oriented to the right. Furthermore, the direction of the main sensitivity axis of the second magnetic sensor 12b is oriented to the front, and the direction of the sub-sensitivity axis thereof is oriented to the right. In other words, the first magnetic sensor 12a and the second magnetic sensor 12b have the same configuration, and the angles defined by the directions of the main sensitivity axes and the directions of the sub-sensitivity axes are almost equal. Here, principal surfaces of the first magnetic sensor 12a and the second magnetic sensor 12b on the top sides (on the GMR-element sides) are considered as the front surfaces of the first magnetic sensor 12a and the second magnetic sensor 12b, respectively. Furthermore, principal surfaces of the first magnetic sensor 12a and the second magnetic sensor 12b on the bottom sides (on the board sides) are considered as the rear surfaces of the first magnetic sensor 12a and the second magnetic sensor 12b, respectively. Note that the relationship about the front surfaces and the rear surfaces may be reversed.

Next, as illustrated in FIG. 10B, the first magnetic sensor 12a is placed on a placement surface of the first circuit board 13a, and the second magnetic sensor 12b is placed on a placement surface of the second circuit board 13b. In the present embodiment, the first magnetic sensor 12a is placed so that the front surface of the first magnetic sensor 12a and the placement surface of the first circuit board 13a face each other, and the second magnetic sensor 12b is placed so that the rear surface of the second magnetic sensor 12b and the placement surface of the second circuit board 13b face each other. Accordingly, as illustrated in FIG. 10B, when both the placement surface of the first circuit board 13a and the placement surface of the second circuit board 13b are oriented to the top and the directions (the arrows 14a and 14b) of the individual main sensitivity axes of the first magnetic sensor 12a and the second magnetic sensor 12b are oriented in the same direction, the directions (the arrows 15a and 15b) of the individual sub-sensitivity axes of the first magnetic sensor 12a and the second magnetic sensor 12b are oriented in directions opposite to each other.

After that, as illustrated in FIG. 10C, the first circuit board 13a and the second circuit board 13b are placed around the current line 11 so that the placement surface of the first circuit board 13a and the placement surface of the second circuit board 13b face each other and the current line 11 is positioned between the placement surface of the first circuit board 13a and the placement surface of the second circuit board 13b. Such an arrangement can be realized, for example, by rotating a set of the first magnetic sensor 12a and the first circuit board 13a with respect to a set of the second magnetic sensor 12b and the second circuit board 13b.

In the current sensor 1 obtained using the method illustrated in FIGS. 10A to 10C, the first magnetic sensor 12a and the second magnetic sensor 12b are symmetrically placed with respect to the current line 11. Thus, the distance between the current line 11 and the first magnetic sensor 12a and the distance between the current line 11 and the second magnetic sensor 12b are easily made equal. Accordingly, because disturbance magnetic fields can be made to appropriately cancel each other out, the accuracy with which a current is measured can be markedly increased. Furthermore, because no circuit board is present between the current line 11 and the first magnetic sensor 12a and between the current line 11 and the second magnetic sensor 12b, the distance between the current line 11 and the first magnetic sensor 12a and the distance between the current line 11 and the second magnetic sensor 12b can be reduced. Therefore, the outputs of the magnetic sensors can be increased, and the accuracy with which a current is measured can be markedly increased.

Furthermore, because magnetic sensors having the same configuration can be used as the first magnetic sensor 12a and the second magnetic sensor 12b, the characteristics of the two magnetic sensors are easily made to match. Therefore, the influences of disturbance magnetic fields can be made to accurately cancel each other out, and a reduction in the accuracy with which a current is measured can be prevented.

As described above, in the current sensor 1 according to the present embodiment, the influences of disturbance magnetic fields can be reduced, and a reduction in the accuracy with which a current is measured can be prevented. The reason for this is that, in the current sensor 1 according to the present embodiment, the first magnetic sensor 12a and the second magnetic sensor 12b are placed in such a manner that the directions of the sub-sensitivity axes thereof are oriented in a certain direction so that disturbance magnetic fields can be made to appropriately cancel each other out.

Note that, in FIGS. 9A and 9B and 10A to 10C, a case where the direction of the main sensitivity axis of the first magnetic sensor 12a is oriented in the direction of the induction field A generated by the measurement target current I flowing through the current line 11 and where the direction of the main sensitivity axis of the second magnetic sensor 12b is oriented in the direction opposite to the direction of the induction field A generated by the measurement target current I flowing through the current line 11 is provided as an example. However, the configuration of the current sensor 1 according to the present embodiment is not limited thereto. The direction of the main sensitivity axis of the first magnetic sensor 12a may be oriented in the direction opposite to the direction of the induction field A generated by the measurement target current I flowing through the current line 11, and the direction of the main sensitivity axis of the second magnetic sensor 12b may be oriented in the direction of the induction field A generated by the measurement target current I flowing through the current line 11.

Additionally, in FIGS. 9A and 9B and 10A to 10C, a configuration in which disturbance magnetic fields are made to cancel each other out by calculating the difference between the outputs is described. However, the configuration of the current sensor 1 according to the present embodiment is not limited thereto. A configuration in which disturbance magnetic fields are made to cancel each other out by calculating the sum of the outputs may be provided. In this case, both of the directions of the individual main sensitivity axes of the first magnetic sensor 12a and the second magnetic sensor 12b are oriented in the direction opposite to the direction of the induction field A generated by the measurement target current I flowing through the current line 11, and the directions of the individual sub-sensitivity axes of the first magnetic sensor 12a and the second magnetic sensor 12b may be oriented in directions opposite to each other.

Furthermore, in FIGS. 9A and 9B and 10A to 10C, the current sensor 1 having a configuration in which the placement surface of the first circuit board 13a and the placement surface of the second circuit board 13b face each other and in which the current line 11 is positioned between the placement surface of the first circuit board 13a and the placement surface of the second circuit board 13b is described. The configuration of the current sensor 1 according to the embodiment is not limited thereto. A configuration in which a surface of the first circuit board 13a on a side opposite a side on which the placement surface of the first circuit board 13a is positioned and a surface of the second circuit board 13b on a side opposite a side on which the placement surface of the second circuit board 13b is positioned face each other, and in which the current line 11 is positioned between the surface of the first circuit board 13a and the surface of the second circuit board 13b may be provided.

In addition, the present embodiment may be implemented by appropriately combining the configuration described in the present embodiment with a configuration described in another embodiment.

Fifth Embodiment

Figure 11A:
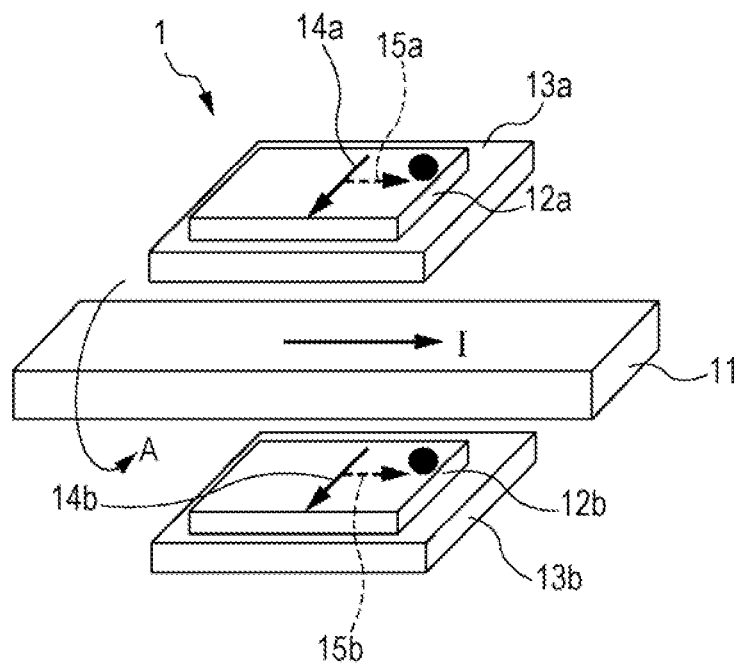
FIGS. 11A and 11B are schematic diagrams illustrating an example of a configuration of a current sensor according to a fifth embodiment.
Figure 11B:
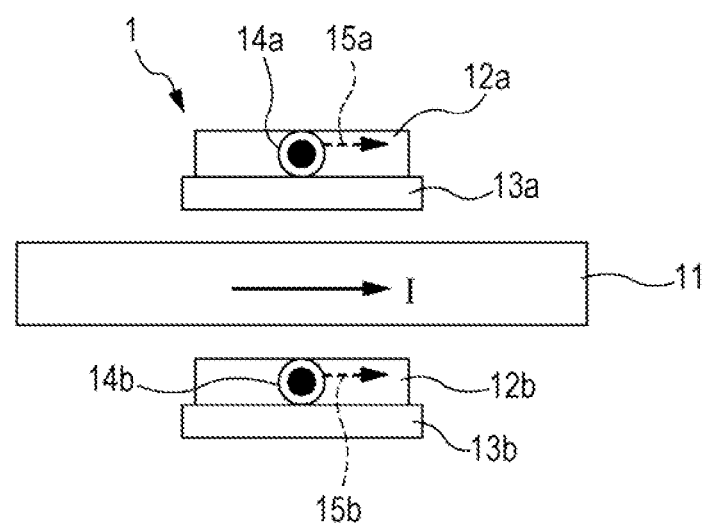

In a present embodiment, another example of the current sensor 1 according to the present invention will be described. FIGS. 11A and 11B are schematic diagrams illustrating a current sensor 1 according to the present embodiment. FIG. 11A is a perspective view schematically illustrating a configuration of the current sensor 1 and the surroundings thereof, and FIG. 11B is a plan view of the current sensor 1 when the current sensor 1 is viewed from the lower left of the page (the front) in FIG. 11A.

As illustrated in FIGS. 11A and 11B, the current sensor 1 according to the present embodiment includes a first magnetic sensor 12a and a second magnetic sensor 12b that are placed around a current line 11, and further includes a first circuit board 13a on which the first magnetic sensor 12a is placed, and a second circuit board 13b on which the second magnetic sensor 12b is placed. Moreover, the current sensor 1 further includes a computing device that performs computation using the output of the first magnetic sensor 12a and the output of the second magnetic sensor 12b. In this regard, there is a commonality between the current sensor 1 illustrated in FIGS. 11A and 11B and the current sensor 1 illustrated in FIGS. 1A and 1B. The difference between the current sensor 1 illustrated in FIGS. 11A and 11B and the current sensor 1 illustrated in FIGS. 1A and 1B is the positional relationship between the first magnetic sensor 12a and the second magnetic sensor 12b and the first circuit board 13a and the second circuit board 13b. In other words, in the current sensor 1 according to the present embodiment, the first circuit board 13a and the second circuit board 13b are placed so that a surface of the first circuit board 13a on a side opposite a side on which a placement surface of the first circuit board 13a is positioned and a placement surface of the second circuit board 13b face each other and the current line 11 is positioned between the surface of the first circuit board 13a and the placement surface of the second circuit board 13b. Furthermore, magnetic sensors having the same configuration are used as the first magnetic sensor 12a and the second magnetic sensor 12b. Therefore, when the first magnetic sensor 12a and the second magnetic sensor 12b are viewed from the front-surface sides thereof, an angle defined by the direction of the main sensitivity axis and the direction of the sub-sensitivity axis of the first magnetic sensor 12a and an angle defined by the direction of the main sensitivity axis and the direction of the sub-sensitivity axis of the second magnetic sensor 12b are almost equal. Here, preferably, the first magnetic sensor 12a and the second magnetic sensor 12b include elements which have been produced using the same wafer and which have the same configuration. In such magnetic sensors, because the sensitivities along the main sensitivity axes or sub-sensitivity axes can be the same, the influences of disturbance magnetic fields can be made to easily cancel each other out.

In the current sensor 1 illustrated in FIGS. 11A and 11B, the first magnetic sensor 12a and the second magnetic sensor 12b are placed around the current line 11 so as to have outputs having almost opposite phases due to an induction field A generated by a measurement target current I flowing through the current line 11. More specifically, the first magnetic sensor 12a and the second magnetic sensor 12b are placed so that the direction (an arrow 14a) of the main sensitivity axis of the first magnetic sensor 12a is oriented in the direction of the induction field A generated by the measurement target current I flowing through the current line 11, the direction (an arrow 14b) of the main sensitivity axis of the second magnetic sensor 12b is oriented in the direction opposite to the direction of the induction field A generated by the measurement target current I flowing through the current line 11, and the directions of the individual main sensitivity axes of the first magnetic sensor 12a and the second magnetic sensor 12b are oriented in the same direction. Moreover, the first magnetic sensor 12a and the second magnetic sensor 12b are placed so that the directions (arrows 15a and 15b) of the individual sub-sensitivity axes thereof are oriented in the same direction. Additionally, the first magnetic sensor 12a is placed so that the rear surface thereof is oriented to the current line 11, and the second magnetic sensor 12b is placed so that the front surface thereof is oriented to the current line 11.

In the current sensor 1 having the configuration illustrated in FIGS. 11A and 11B, the direction of the main sensitivity axis of one of the first magnetic sensor 12a and the second magnetic sensor 12b is oriented in the direction of the induction field A generated by the measurement target current I flowing through the current line 11, and the direction of the main sensitivity axis of the other magnetic sensor is oriented in the direction opposite to the direction of the induction field A generated by the measurement target current I flowing through the current line 11. Thus, the influence of the induction field A appears as output signals of the first magnetic sensor 12a and the second magnetic sensor 12b that are signals having almost opposite phases. Furthermore, the directions of the individual main sensitivity axes of the first magnetic sensor 12a and the second magnetic sensor 12b are oriented in the same direction, and the directions of the individual sub-sensitivity axes of the first magnetic sensor 12a and the second magnetic sensor 12b are oriented in the same direction. Thus, the influences of disturbance magnetic fields appear equally in the output of the first magnetic sensor 12a and the output of the second magnetic sensor 12b. Therefore, by calculating the difference between the output of the first magnetic sensor 12a and the output of the second magnetic sensor 12b, the influences of disturbance magnetic fields can be markedly reduced, and a reduction in the accuracy with which a current is measured can be prevented.

FIGS. 12A to 12C are schematic diagrams illustrating an example of a method for producing the current sensor 1 according to the present embodiment. As illustrated in FIG. 12A, first, the first magnetic sensor 12a and the second magnetic sensor 12b are prepared. In FIG. 12A, the direction of the main sensitivity axis of the first magnetic sensor 12a is oriented to the front, and the direction of the sub-sensitivity axis thereof is oriented to the right. Furthermore, the direction of the main sensitivity axis of the second magnetic sensor 12b is oriented to the front, and the direction of the sub-sensitivity axis thereof is oriented to the right. In other words, the first magnetic sensor 12a and the second magnetic sensor 12b have the same configuration, and the angles defined by the directions of the main sensitivity axes and the directions of the sub-sensitivity axes are almost equal. Here, principal surfaces of the first magnetic sensor 12a and the second magnetic sensor 12b on the top sides (on the GMR-element sides) are considered as the front surfaces of the first magnetic sensor 12a and the second magnetic sensor 12b, respectively. Furthermore, principal surfaces of the first magnetic sensor 12a and the second magnetic sensor 12b on the bottom sides (on the board sides) are considered as the rear surfaces of the first magnetic sensor 12a and the second magnetic sensor 12b, respectively. Note that the relationship about the front surfaces and the rear surfaces may be reversed.

Next, as illustrated in FIG. 12B, the first magnetic sensor 12a is placed on a placement surface of the first circuit board 13a, and the second magnetic sensor 12b is placed on a placement surface of the second circuit board 13b. In the present embodiment, the first magnetic sensor 12a is placed so that the rear surface of the first magnetic sensor 12a and the placement surface of the first circuit board 13a face each other, and the second magnetic sensor 12b is placed so that the rear surface of the second magnetic sensor 12b and the placement surface of the second circuit board 13b face each other. In other words, a set of the first magnetic sensor 12a and the first circuit board 13a and a set of the second magnetic sensor 12b and the second circuit board 13b have the same configuration. Therefore, as illustrated in FIG. 12B, when both the placement surface of the first circuit board 13a and the placement surface of the second circuit board 13b are oriented to the top and the directions (the arrows 14a and 14b) of the individual main sensitivity axes of the first magnetic sensor 12a and the second magnetic sensor 12b are oriented in the same direction, the directions (the arrows 15a and 15b) of the individual sub-sensitivity axes of the first magnetic sensor 12a and the second magnetic sensor 12b are also oriented in the same direction.

After that, as illustrated in FIG. 12C, the first circuit board 13a and the second circuit board 13b are placed around the current line 11 so that the surface of the first circuit board 13a on the side opposite the side on which the placement surface of the first circuit board 13a is positioned and the placement surface of the second circuit board 13b face each other and the current line 11 is positioned between the surface of the first circuit board 13a and the placement surface of the second circuit board 13b.

In the current sensor 1 obtained using the method illustrated in FIGS. 12A to 12C, magnetic sensors having the same configuration can be used as the first magnetic sensor 12a and the second magnetic sensor 12b. Thus, the characteristics of the two magnetic sensors are easily made to match. Therefore, the influences of disturbance magnetic fields can be made to accurately cancel each other out, and a reduction in the accuracy with which a current is measured can be prevented. Furthermore, the implementation pattern of the first magnetic sensor 12a for the first circuit board 13a and the implementation pattern of the second magnetic sensor 12b for the second circuit board 13b are the same. Thus, a current sensor can be configured using circuit boards on which magnetic sensors are implemented in the same process. Therefore, the characteristics of the magnetic sensors and the circuit boards can be made to match at low cost.

Figure 13:
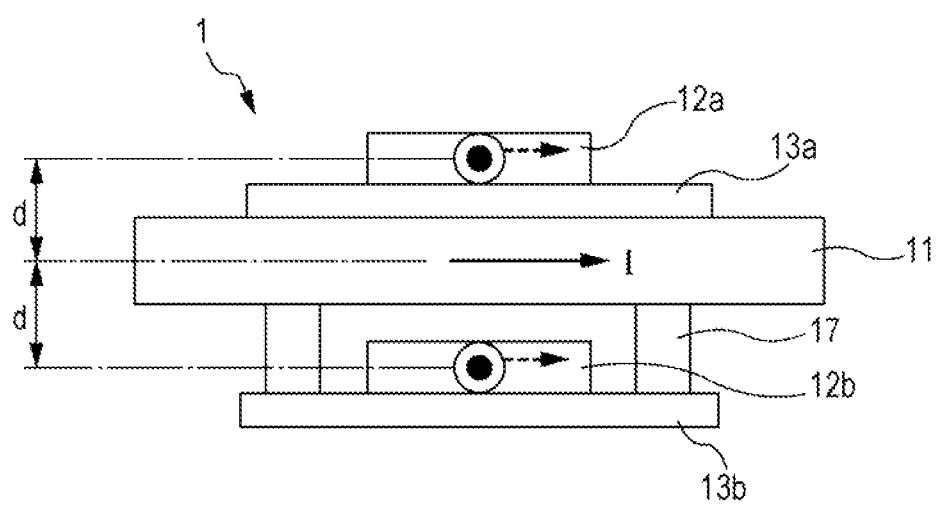
FIG. 13 is a schematic diagram illustrating a modification example of the current sensor according to the fifth embodiment.

FIG. 13 is a schematic diagram illustrating a modification example of the current sensor 1 having the configuration illustrated in FIGS. 11A and 11B. There is a commonality between a basic configuration of the current sensor 1 illustrated in FIG. 13 and the configuration of the current sensor 1 illustrated in FIGS. 11A and 11B. The difference between the current sensor 1 illustrated in FIG. 13 and the current sensor 1 illustrated in FIGS. 11A and 11B is presence or absence of a spacer 17. In other words, in the current sensor 1 illustrated in FIG. 13, the spacer 17 is placed between the current line 11 and the second circuit board 13b. By placing the spacer 17 as described above, the distance between the current line 11 and the first magnetic sensor 12a and the distance between the current line 11 and the second magnetic sensor 12b are easily made equal. Therefore, the accuracy with which a current is measured can be markedly increased.

Note that, in FIG. 13, a configuration in which the spacer 17 is placed between the current line 11 and the second circuit board 13b is illustrated. However, the spacer 17 may be placed between the current line 11 and the second magnetic sensor 12b. Moreover, another spacer may be placed between the current line 11 and the first circuit board 13a (or the first magnetic sensor 12a).

As described above, in the current sensor 1 according to the present embodiment, the influences of disturbance magnetic fields can be reduced, and a reduction in the accuracy with which a current is measured can be prevented. The reason for this is that, in the current sensor 1 according to the present embodiment, the first magnetic sensor 12a and the second magnetic sensor 12b are placed in such a manner that the directions of the sub-sensitivity axes thereof are oriented in a certain direction so that disturbance magnetic fields can be made to appropriately cancel each other out.

Note that, in FIGS. 11A and 11B, 12A to 12C, and 13, a case where the direction of the main sensitivity axis of the first magnetic sensor 12a is oriented in the direction of the induction field A generated by the measurement target current I flowing through the current line 11 and where the direction of the main sensitivity axis of the second magnetic sensor 12b is oriented in the direction opposite to the direction of the induction field A generated by the measurement target current I flowing through the current line 11 is provided as an example. However, the configuration of the current sensor 1 according to the present embodiment is not limited thereto. The direction of the main sensitivity axis of the first magnetic sensor 12a may be oriented in the direction opposite to the direction of the induction field A generated by the measurement target current I flowing through the current line 11, and the direction of the main sensitivity axis of the second magnetic sensor 12b may be oriented in the direction of the induction field A generated by the measurement target current I flowing through the current line 11.

Additionally, in FIGS. 11A and 11B, 12A to 12C, and 13, a configuration in which disturbance magnetic fields are made to cancel each other out by calculating the difference between the outputs is described. However, the configuration of the current sensor 1 according to the present embodiment is not limited thereto. A configuration in which disturbance magnetic fields are made to cancel each other out by calculating the sum of the outputs may be provided. In this case, both of the directions of the individual main sensitivity axes of the first magnetic sensor 12a and the second magnetic sensor 12b are oriented in the direction of the induction field A generated by the measurement target current I flowing through the current line 11 or oriented in the direction opposite to the direction of the induction field A, and the directions of the individual sub-sensitivity axes of the first magnetic sensor 12a and the second magnetic sensor 12b may be oriented in directions opposite to each other.

In addition, the present embodiment may be implemented by appropriately combining the configuration described in the present embodiment with a configuration described in another embodiment.

Sixth Embodiment

In a present embodiment, another example of the current sensor 1 according the present invention will be described. A current sensor 1 according to the present embodiment corresponds to a current sensor obtained by applying magnetic sensors using magnetoresistance effect elements as the first magnetic sensor 12a and the second magnetic sensor 12b in the current sensor 1 described in any one of the first to fifth embodiments.

A first magnetic sensor 12a and a second magnetic sensor 12b in the present embodiment are magnetic-proportion-system sensors or magnetic-balance-system sensors. A magnetic-proportion-system sensor is configured, for example, so as to include a bridge circuit constituted by two magnetoresistance effect elements, which are magnetic sensor elements, and two fixed resistance elements. Furthermore, a magnetic-balance-system sensor is configured, for example, so as to include the following: a bridge circuit constituted by two magnetoresistance effect elements, which are magnetic sensor elements, and two fixed resistance elements; and a feedback coil that is placed so as to be capable of generating a magnetic field in a certain direction so that the magnetic field and a magnetic field generated by a measurement target current will cancel each other out. In the case where magnetic-proportion-system sensors are employed, a feedback coil and a configuration regarding control of the feedback coil as in the case of magnetic-balance-system sensors are unnecessary. Thus, the configuration of a current sensor can be simplified, and the size reduction of the current sensor can be achieved. In contrast, in the case where magnetic-balance-system sensors are employed, a current sensor whose response speed is high and whose temperature dependence is low is easily realized.

Examples of magnetoresistance effect elements that can be used in the first magnetic sensor 12a and the second magnetic sensor 12b include GMR elements and TMR elements. Here, GMR elements, each of which has sensitivity also in a direction orthogonal to the sensitivity axis thereof, are used. Magnetoresistance effect elements, such as GMR elements, have characteristics in which a resistance value changes due to application of an induction field generated by a measurement target current. By using these characteristics for the first magnetic sensor 12a and the second magnetic sensor 12b, the magnitude of an induction field can be detected.

Preferably, the first magnetic sensor 12a and the second magnetic sensor 12b include elements which have been produced using the same wafer and which have the same configuration. In such magnetic sensors, the sensitivities along the main sensitivity axes or sub-sensitivity axes can be the same. Thus, the influences of disturbance magnetic fields can be markedly reduced, and a reduction in the accuracy with which a current is measured can be prevented.

Figure 14A:
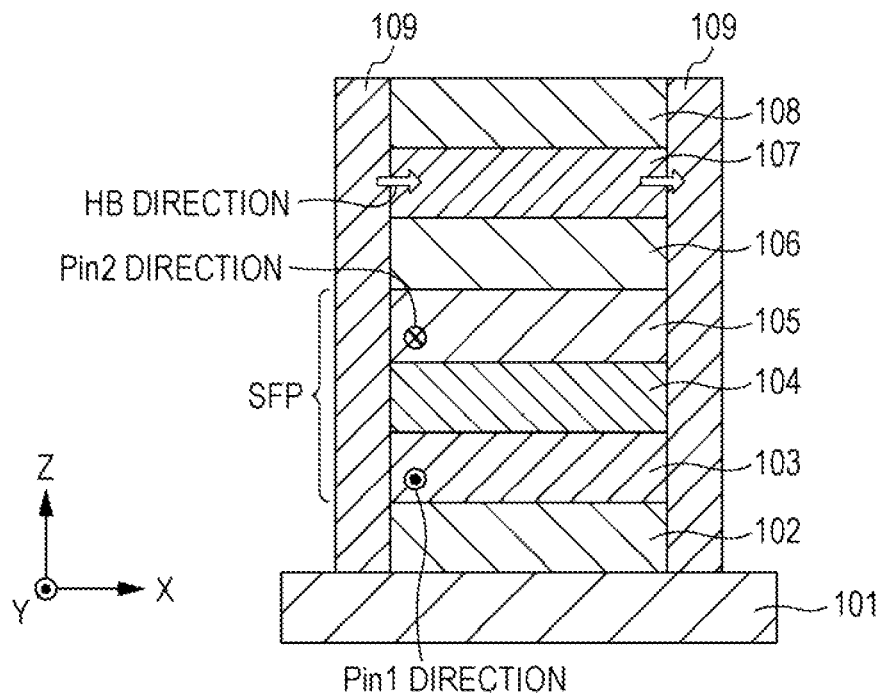
FIGS. 14A and 14B are schematic diagrams illustrating a configuration of a GMR element in a sixth embodiment.
Figure 14B:
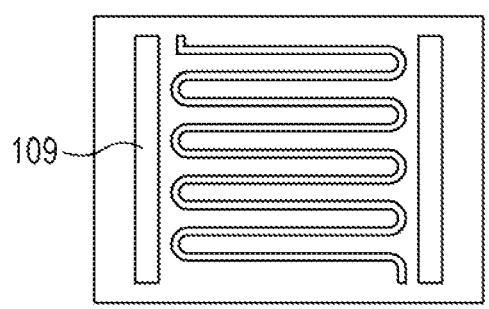

FIGS. 14A and 14B are schematic diagrams illustrating a configuration of each of GMR elements used in the first magnetic sensor 12a and the second magnetic sensor 12b. FIG. 14A illustrates a cross-sectional structure, and FIG. 14B illustrates a planar structure. As illustrated in FIG. 14A, a GMR element has a layered structure in which a plurality of films are provided on a substrate 101. In other words, the GMR element includes a seed layer 102, a first ferromagnetic film 103, an antiparallel coupling film 104, a second ferromagnetic film 105, a nonmagnetic intermediate layer 106, a soft magnetic free layer (magnetic free layer) 107, and a protective layer 108. Furthermore, as illustrated in FIG. 14B, the GMR element has a shape (meandering shape) in which a plurality of long strip patterns (stripes) that are placed so as to be parallel to each other in the longitudinal direction are connected at the ends with curved portions.

In the GMR element, the first ferromagnetic film 103 and the second ferromagnetic film 105 are coupled to each other through the antiparallel coupling film 104 in an antiferromagnetic manner, whereby a so-called self-pinned ferromagnetic pinned layer (a synthetic ferri-pinned (SFP) layer) is formed. As described above, the GMR element illustrated in FIGS. 14A and 14B is a spin-valve-type element using the ferromagnetic pinned layer, the nonmagnetic intermediate layer 106, and the soft magnetic free layer 107. Note that, in FIGS. 14A and 14B, for simplicity of description, an underlying layer or the like that is not included in the GMR element is omitted. However, an underlying layer that is composed of a nonmagnetic material which contains at least one element among, for example, Ta, Hf, Nb, Zr, Ti, Mo, and W may be provided between the substrate 101 and the seed layer 102.

The seed layer 102 is composed of, for example, NiFeCr or Cr. Preferably, the first ferromagnetic film 103 is composed of a CoFe alloy containing 40 to 80 atomic percent Fe. The reason for this is that a CoFe alloy having this composition range has a great coercive force and causes magnetization to be kept stable against an external magnetic field. Note that, while the first ferromagnetic film 103 is being formed, a magnetic field in the direction perpendicular to the longitudinal direction of the meandering shape (in the direction from the rear side to the front side in FIG. 14A, in the direction from the top side to the bottom side in FIG. 14B) is applied to the first ferromagnetic film 103, whereby induced magnetic anisotropy is added to the first ferromagnetic film 103. The antiparallel coupling film 104 is composed of Ru or the like. Furthermore, preferably, the second ferromagnetic film 105 is composed of a CoFe alloy containing 0 to 40 atomic percent Fe. The reason for this is that a CoFe alloy having this composition range has a small coercive force and causes the second ferromagnetic film 105 to be easily magnetized in the direction (a direction obtained by being rotated by 180°) that is antiparallel to a direction in which the first ferromagnetic film 103 is preferentially magnetized. Note that, while the second ferromagnetic film 105 is being formed, a magnetic field that is similar to the magnetic field applied to the first ferromagnetic film 103 while the first ferromagnetic film 103 is being formed (a magnetic field in the direction perpendicular to the longitudinal direction of the meandering shape) is applied to the second ferromagnetic film 105, whereby induced magnetic anisotropy is added to the second ferromagnetic film 105. By forming films while such magnetic fields are being applied to the films, the first ferromagnetic film 103 is preferentially magnetized in the direction of the applied magnetic field (hereinafter, referred to as a "Pin1 direction"), and the second ferromagnetic film 105 is magnetized in the direction (a direction obtained by being rotated by 180°, hereinafter, referred to as a "Pin2 direction") that is antiparallel to the direction in which the first ferromagnetic film 103 is magnetized. The nonmagnetic intermediate layer 106 is composed of Cu or the like.

Furthermore, the soft magnetic free layer (magnetic free layer) 107 is composed of a magnetic material, such as a CoFe alloy, a NiFe alloy, or a CoFeNi alloy. Note that, preferably, while the soft magnetic free layer 107 is being formed, a magnetic field in the longitudinal direction of the meandering shape (the direction perpendicular to the Pin2 direction, the X-axis direction) is applied to the soft magnetic free layer 107, whereby induced magnetic anisotropy is added to the soft magnetic free layer 107 that has been formed. Accordingly, a low-hysteresis GMR element whose resistance changes linearly with an external magnetic field in the X-axis direction can be obtained. The protective layer 108 is composed of Ta, Ru, or the like.

Preferably, the GMR element has hard bias layers 109, and a certain magnetic field is applied from one of the hard bias layers 109 to the soft magnetic free layer (magnetic free layer)

107. The direction of the magnetic field (hereinafter, referred to as a "hard bias (HB)") that is applied from one of the hard bias layers 109 is the longitudinal direction of the meandering shape (the direction perpendicular to the Pin2 direction, the X-axis direction). The sensibility of the GMR element can be increased using the hard bias layers 109.

Furthermore, using the hard bias layers 109, the sensitivity axis of the GMR element is controlled so as to be oriented in the direction perpendicular to the direction of the hard bias, and the sub-sensitivity axis of thereof is controlled so as to be oriented in the direction of the hard bias. Therefore, by utilizing this, the directions of the hard biases of GMR elements that are to be used in a current sensor can be aligned, and a configuration in which the influences of disturbance magnetic fields that appear in the directions of the sub-sensitivity axes can be made to appropriately cancel each other out can be realized. More specifically, in a current sensor in which the difference between outputs is calculated, the directions of the hard biases of GMR elements are controlled so that the sub-sensitivity axis of the first magnetic sensor 12a and the sub-sensitivity axis of the second magnetic sensor 12b will be oriented in the same direction. In a current sensor in which the sum of outputs is calculated, the directions of the hard biases of GMR elements are controlled so that the sub-sensitivity axis of the first magnetic sensor 12a and the sub-sensitivity axis of the second magnetic sensor 12b will be oriented in opposite directions. Accordingly, the influences of disturbance magnetic fields can be reduced, and a reduction in the accuracy with which a current is measured is prevented.

In the above-described GMR element and a magnetic sensor including the GMR elements, the direction of the main sensitivity axis is the Pin2 direction. Furthermore, the direction of the sub-sensitivity axis is the direction perpendicular to the Pin2 direction. The above-described GMR element and a magnetic sensor including the GMR elements have no substantial sensibility in the direction perpendicular to the films.

Figure 15A:
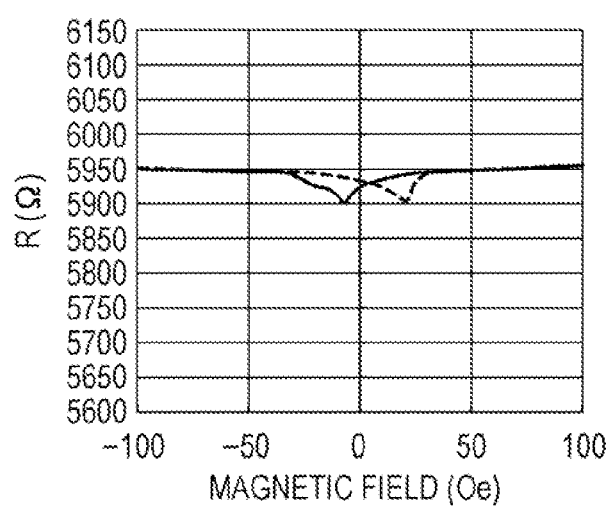
FIGS. 15A to 15C are graphs illustrating the resistance value of the GMR element in the case where a magnetic field is applied to the GMR element in the direction of a sub-sensitivity axis thereof.
Figure 15B:
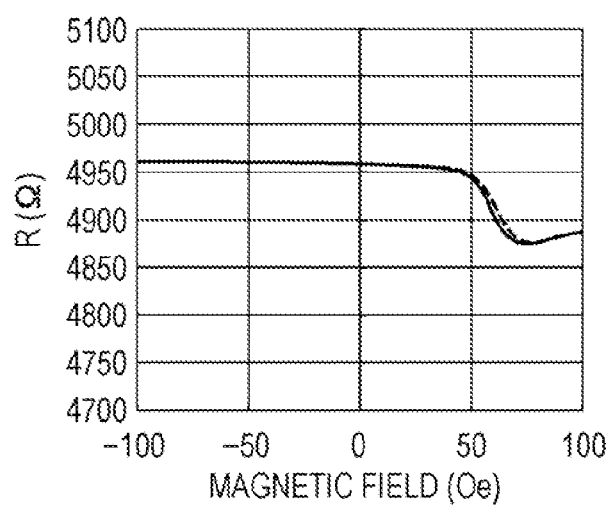
Figure 15C:
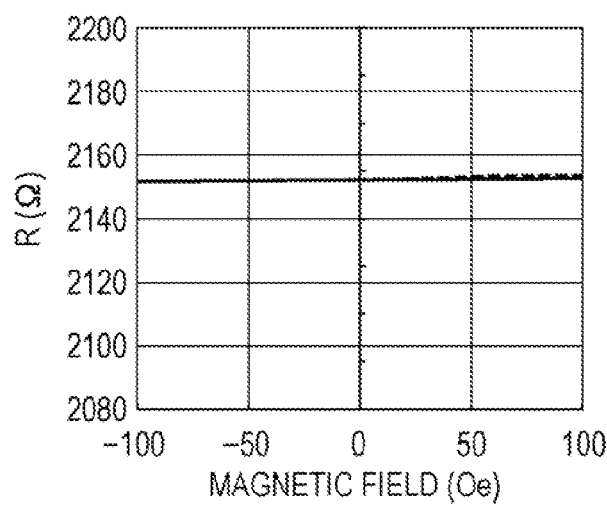

FIGS. 15A to 15C are graphs illustrating the resistance value of the GMR element (i.e., the sensitivity of the GMR element) in the case where a magnetic field is applied to the GMR element in the sub-sensitivity axis thereof. In FIGS. 15A to 15C, the horizontal axis represents the magnitude of an applied magnetic field in the direction of the sub-sensitivity axis (i.e., the direction of the hard bias). When the magnitude of the applied magnetic field is a negative value, this indicates that a magnetic field in the direction of the hard bias is applied. When the magnitude of the applied magnetic field is a positive value, this indicates that a magnetic field in the direction opposite to the direction of the hard bias is applied. The vertical axis represents the resistance value of the GMR element. Furthermore, the solid lines represent the characteristics of a first GMR element, and the broken lines represent the characteristics of a second GMR element.

FIG. 15A illustrates the characteristics in the case where the hard bias is very weak, FIG. 15B illustrates the characteristics in the case where the hard bias is strong, and FIG. 15C illustrates the characteristics in the case where the hard bias is very strong. As illustrated in FIG. 15A, in the case where the hard bias is weak, the sensitivity characteristics in the directions of the sub-sensitivity axes of the two GMR elements are markedly different from each other. When a magnetic field in the negative direction is applied to the first GMR element, the resistance value of the first GMR element decreases. In contrast, when a magnetic field in the positive direction is applied to the second GMR element, the resistance value of the second GMR element decreases. This indicates that the directions of the sub-sensitivity axes are not aligned. In this case, it is difficult to make the influences of disturbance magnetic fields that appear in the directions of the sub-sensitivity axes accurately cancel each other out. In contrast, as illustrated in FIGS. 15B and 15C, in the case where the hard bias is strong, the sensitivity characteristics in the directions of the sub-sensitivity axes of the two GMR elements match. In this case, the influences of disturbance magnetic fields that appear in the directions of the sub-sensitivity axes can be made to accurately cancel each other out.

As described above, in the case where magnetic sensors using magnetoresistance effect elements are used as the first magnetic sensor 12a and the second magnetic sensor 12b, the sensitivity characteristics in the directions of the sub-sensitivity axes are controlled using the hard biases, whereby the influences of disturbance magnetic fields that appear in the directions of the sub-sensitivity axes can be made to accurately cancel each other out. Therefore, a reduction in the accuracy with which a current is measured can be prevented.

The present embodiment may be implemented by appropriately combining the configuration described in the present embodiment with a configuration described in another embodiment.

Seventh Embodiment

Figure 16A:
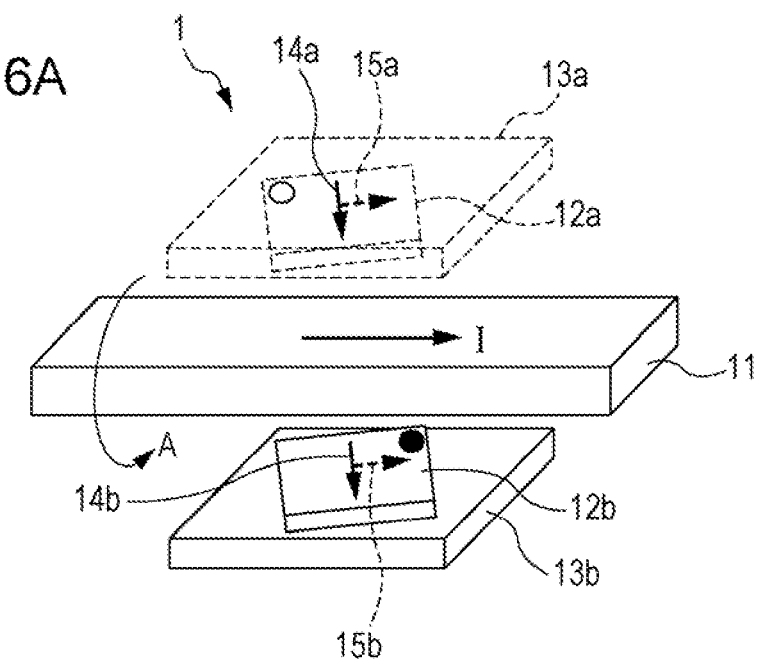
FIGS. 16A to 16C are schematic diagrams illustrating an example of a configuration of a current sensor according to a seventh embodiment.
Figure 16B:
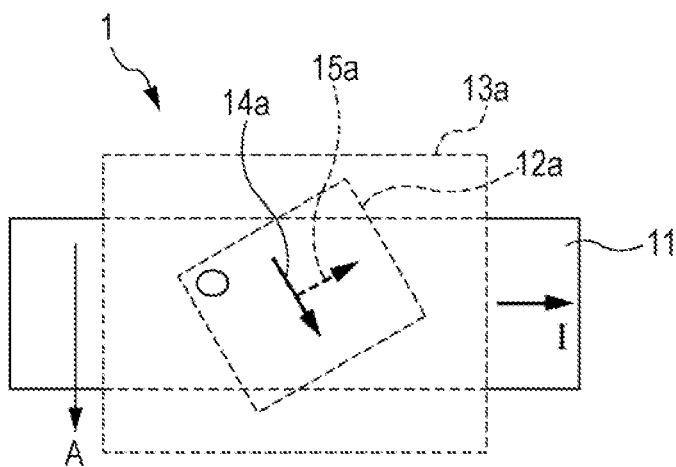
Figure 16C:
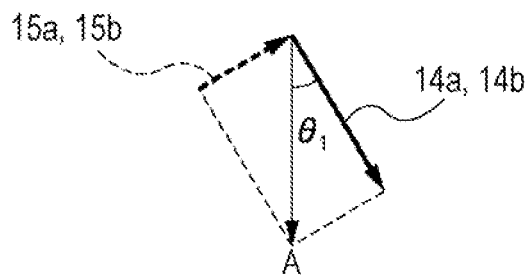
Figure 17A:
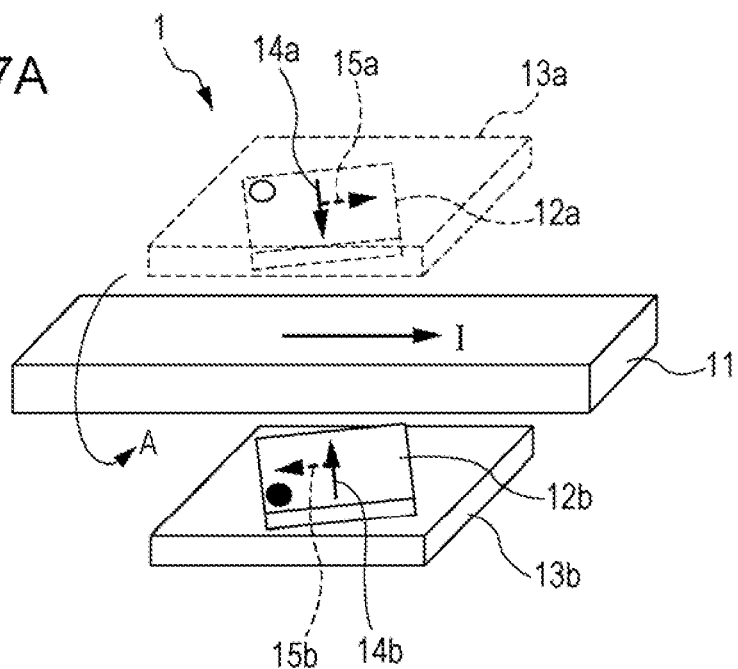
FIGS. 17A to 17C are schematic diagrams illustrating another example of the configuration of the current sensor according to the seventh embodiment.
Figure 17B:
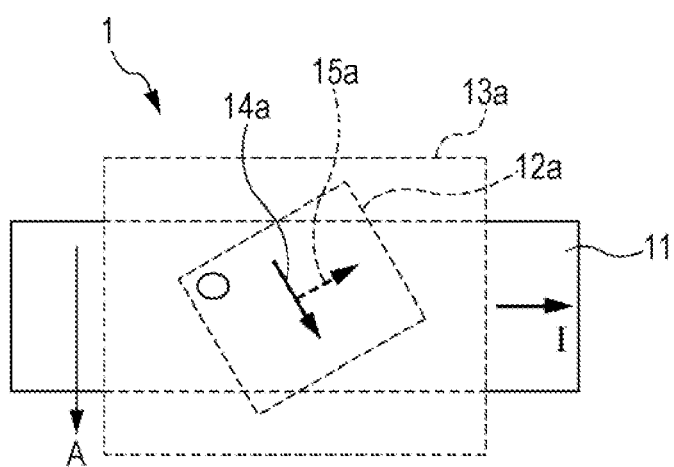
Figure 17C:
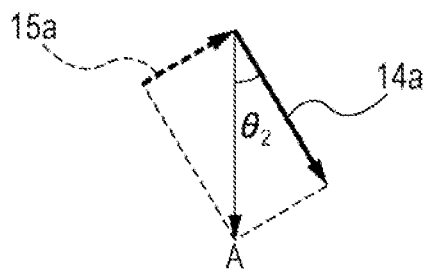

In a present embodiment, another example of the current sensor 1 according the present invention will be described. FIGS. 16A to 16C are schematic diagrams illustrating an example of a current sensor 1 according to the present embodiment. FIG. 16A is a perspective view schematically illustrating a configuration of the current sensor 1 and the surroundings thereof. FIG. 16B is a plan view of the current sensor 1 when the current sensor 1 is viewed from the top of the page in FIG. 16A. FIG. 16C is a schematic diagram illustrating the relationship between the direction of the main sensitivity axis and the direction of the sub-sensitivity axis of each magnetic sensor and the direction of an induction field. Furthermore, FIGS. 17A to 17C are schematic diagrams illustrating another example of the current sensor 1 according to the present embodiment. FIG. 17A is a perspective view schematically illustrating a configuration of the current sensor 1 and the surroundings thereof. FIG. 17B is a plan view of the current sensor 1 when the current sensor 1 is viewed from the top of the page in FIG. 17A. FIG. 17C is a schematic diagram illustrating the relationship between the direction of the main sensitivity axis and the direction of the sub-sensitivity axis of each magnetic sensor and the direction of an induction field.

As illustrated in FIGS. 16A to 16C and 17A to 17C, there is a commonality between a basic configuration of the current sensor 1 according to the present embodiment and the configuration of the current sensor 1 according to each of the foregoing first to sixth embodiments. In contrast, the current sensor 1 according to the present embodiment is different from the current sensor 1 according to each of the foregoing first to sixth embodiments in that each of the directions (arrows 14a and 14b) of the main sensitivity axes is not oriented in a direction parallel to the direction of an induction field A.

The current sensor 1 illustrated in FIGS. 16A to 16C has a configuration in which the first magnetic sensor 12a and the second magnetic sensor 12b of the current sensor illustrated in FIGS. 1A and 1B are rotated on an axis perpendicular to the placement surfaces, which is used as the axis of rotation, by a predetermined angle (see FIGS. 16A and 16B). Specifically, as illustrated in FIG. 16C, the current sensor 1 is configured so that an angle θ1 is defined by the direction of the main sensitivity axis of each of the first magnetic sensor 12a and the second magnetic sensor 12b and the direction of the induction field A. In other words, the direction (the arrow 14a) of the main sensitivity axis of the first magnetic sensor 12a is oriented in a direction that is not parallel to the direction of the induction field A generated by a measurement target current I flowing through a current line 11. The direction (the arrow 14b) of the main sensitivity axis of the second magnetic sensor 12b is oriented in a direction that is not parallel to the direction of the induction field A generated by the measurement target current I flowing through the current line 11. However, as in each of the first to sixth embodiments, the directions of the main sensitivity axes are not orthogonal to the direction of the induction field A so that the current sensor 1 will have sensitivity to the induction field A. In other words, an expression $\theta_1 \neq 90° \times n$ (n is an integer) is satisfied.

In the current sensor 1 according to the present embodiment in which the predetermined angle is defined by each of the directions of the main sensitivity axes and the direction of the induction field A, an element of the induction field A in the direction of the main sensitivity axis is detected. When the angle defined by each of the directions of the main sensitivity axes and the direction of the induction field A is denoted by $\theta 1$ and the magnitude of the induction field A is denoted by HA, a magnitude H of a magnetic field that is applied to each of the first magnetic sensor 12a and the second magnetic sensor 12b is represented by an expression $HA\cos\theta 1$ (<HA). In other words, each of the first magnetic sensor 12a and the second magnetic sensor 12b is placed so that the direction of the main sensitivity axis is inclined by the angle $\theta 1$ with respect to the direction of the induction field A. Thus, the magnitude H of a magnetic field that is applied to each of the first magnetic sensor 12a and the second magnetic sensor 12b is smaller than the magnitude HA of the induction field A. Therefore, the magnitude of a magnetic field that is applied to each of the first magnetic sensor 12a and the second magnetic sensor 12b is adjusted using the angle $\theta 1$, whereby the measurable range of the current sensor 1 can be adjusted.

Note that, in the current sensor 1 illustrated in FIGS. 16A to 16C, the directions of the individual main sensitivity axes of the first magnetic sensor 12a and the second magnetic sensor 12b are oriented in the same direction. The directions of the individual sub-sensitivity axes of the first magnetic sensor 12a and the second magnetic sensor 12b are oriented in the same direction. Thus, the influences of disturbance magnetic fields appear equally in the output of the first magnetic sensor 12a and the output of the second magnetic sensor 12b. Therefore, by calculating the difference between the output of the first magnetic sensor 12a and the output of the second magnetic sensor 12b, the influences of disturbance magnetic fields can be markedly reduced, and a reduction in the accuracy with which a current is measured can be prevented.

The current sensor 1 illustrated in FIGS. 17A to 17C has a configuration in which the first magnetic sensor 12a and the second magnetic sensor 12b of the current sensor illustrated in FIGS. 5A and 5B are rotated by a predetermined angle in planes including the placement surfaces of the first circuit board 13a and the second circuit board 13b (see FIGS. 17A and 17B). Specifically, as illustrated in FIG. 17C, the current sensor 1 is configured so that an angle $\theta_2$ is defined by the direction of the main sensitivity axis of each of the first magnetic sensor 12a and the second magnetic sensor 12b and the direction of the induction field A. In other words, the direction (the arrow 14a) of the main sensitivity axis of the first magnetic sensor 12a is oriented in a direction that is not parallel to the direction of the induction field A generated by a measurement target current I flowing through a current line 11. The direction (the arrow 14b) of the main sensitivity axis of the second magnetic sensor 12b is oriented in a direction that is not parallel to the direction of the induction field A generated by the measurement target current I flowing through the current line 11. However, as in each of the first to sixth embodiments, the directions of the main sensitivity axes are not orthogonal to the direction of the induction field A so that the current sensor 1 will have sensitivity to the induction field A. In other words, an expression $\theta_2 \neq 90° \times n$ (n is an integer) is satisfied. Also in the current sensor 1, the magnitude of a magnetic field that is applied to each of the first magnetic sensor 12a and the second magnetic sensor 12b is adjusted using the angle $\theta_2$, whereby the measurable range of the current sensor 1 can be adjusted.

Note that, in the current sensor 1 illustrated in FIGS. 17A to 17C, the directions of the individual main sensitivity axes of the first magnetic sensor 12a and the second magnetic sensor 12b are oriented in opposite directions. The directions of the individual sub-sensitivity axes of the first magnetic sensor 12a and the second magnetic sensor 12b are oriented in opposite directions. Thus, the influences of disturbance magnetic fields appear oppositely in the output of the first magnetic sensor 12a and the output of the second magnetic sensor 12b. Therefore, by calculating the sum of the output of the first magnetic sensor 12a and the output of the second magnetic sensor 12b, the influences of disturbance magnetic fields can be markedly reduced, and a reduction in the accuracy with which a current is measured can be prevented.

As described above, in the current sensor 1 according to the present embodiment is configured so that a predetermined angle is defined by each of the directions of the main sensitivity axes and the induction field A. By adjusting the angle, the measurable range of the current sensor 1 can be adjusted. For example, the measurable range can be increased by reducing the sensitivity to be lower than that of the current sensor 1 according to each of the first to sixth embodiments in which each of the directions of the main sensitivity axes is oriented in a direction parallel to the direction of the induction field A.

Note that, in the present embodiment, the first magnetic sensor 12a and the second magnetic sensor 12b are rotated so that a predetermined angle is defined by the direction of the induction field A and each of the directions of the main sensitivity axes. However, the first circuit board 13a and the second circuit board 13b may be rotated. Furthermore, in order to prevent the sub-sensitivity axes from being influenced by the induction field A, the first circuit board 13a and the second circuit board 13b (or the first magnetic sensor 12a and the second magnetic sensor 12b) may be rotated, whereby the directions of the sub-sensitivity axes for the induction field A may be controlled. In this case, for example, by making the directions of the sub-sensitivity axes orthogonal to the direction of the induction field A, the influence of the induction field A on the sub-sensitivity axes can be reduced.

In addition, the present embodiment may be implemented by appropriately combining the configuration described in the present embodiment with a configuration described in another embodiment.

As described above, in the current sensor 1 according to the present invention, by controlling the directions of the sub-sensitivity axes in addition to the directions of the main sensitivity axes, disturbance magnetic fields can be made to sufficiently cancel each other out. Accordingly, a reduction in the accuracy with which a current is measured can be prevented.

Note that the present invention is not limited to any one of the foregoing embodiments. Various modifications may be made, and the present invention may be implemented. For example, the arrangement of the individual elements and the size of each of the elements in any one of the foregoing embodiments may be appropriately modified, and the present invention may be implemented. Furthermore, the direction of the measurement target current I flowing through the current line 11 may be reversed. Moreover, the configurations illustrated in the foregoing first to seventh embodiments may be appropriately combined, and the present invention may be implemented. In addition, the present invention may be appropriately modified without departing from the scope of the present invention, and may be implemented.

What is claimed is:

1. A current sensor comprising:
a first magnetic sensor and a second magnetic sensor disposed around a current line such that the current line is positioned therebetween, the current line flowing a measurement target current therethrough, the first and second magnetic sensors detecting an induction magnetic field generated by the measurement target current the first magnetic sensor having a first main sensitivity axis and a first sub-sensitivity axis orthogonal to the first main sensitivity axis, and the second magnetic sensor having a second main sensitivity axis and a second sub-sensitivity axis orthogonal to the second main sensitivity axis,
wherein the first magnetic sensor and the second magnetic sensor are placed such that the first main sensitivity axis is oriented in a direction not orthogonal to a direction of the induction magnetic field applied to the first magnetic sensor, and the second main sensitivity axis is oriented in a direction not orthogonal to a direction of the induction magnetic field applied to the second magnetic sensor, and
wherein the first magnetic sensor and the second magnetic sensor are placed such that the direction of the first main sensitivity axis is the same as the direction of the second main sensitivity axis, and a directions of the first sub-sensitivity axis is the same as a direction of the second sub-sensitivity axis, or such that the direction of the first main sensitivity axis is opposite to the direction of the second main sensitivity axes, and the direction of the first sub-sensitivity axis is opposite to the direction of the second sub-sensitivity axis.

2. The current sensor according to claim 1,
wherein the the first and second main sensitivity axes are oriented in the same direction, and
wherein the current sensor further includes a computing device configured to calculate a difference between an output of the first magnetic sensor and an output of the second magnetic sensor.

3. The current sensor according to claim 1,
wherein the first and second main sensitivity axes are oriented in the opposite directions, and
wherein the current sensor further includes a computing device configured to calculate a sum of an output of the first magnetic sensor and an output of the second magnetic sensor.

4. The current sensor according to claim 1, wherein the current sensor further includes:
a first circuit board having a first placement surface, the first magnetic sensor being placed on the first placement surface, and
a second circuit board having a second placement surface, the second magnetic sensor being placed on the second placement surface, and
wherein the first circuit board and the second circuit board are placed such that the first placement surface and the second placement surface face each other with the current line interposed therebetween.

5. The current sensor according to claim 4,
wherein directions of the first main sensitivity axis and the first sub-sensitivity axis are substantially a mirror-image of directions of the second main sensitivity axis and the second sub-sensitivity axis.

6. The current sensor according to claim 4,
wherein, when the first magnetic sensor and the second magnetic sensor are viewed from respective front-surface sides thereof, an angle defined from a direction of the first main sensitivity axis to a direction of the first sub-sensitivity axis and an angle defined from a direction of the second main sensitivity axis to a direction of the second sub-sensitivity axis are substantially the same,
wherein the first magnetic sensor is placed on the first circuit board so that a front surface thereof faces the first placement surface, and
wherein the second magnetic sensor is placed on the second circuit board so that a rear surface thereof faces the second placement surface.

7. The current sensor according to claim 6, wherein the first magnetic sensor and the second magnetic sensor have substantially the same configuration and are formed from a same wafer.

8. The current sensor according to claim 1, wherein the current sensor further includes:
a first circuit board having a first placement surface, the first magnetic sensor being placed on the first placement surface, and
a second circuit board having a second placement surface, the second magnetic sensor being placed on the second placement surface, and
wherein the first circuit board and the second circuit board are placed such that a back surface of the first circuit board opposite to the first placement surface and a back surface of the second circuit board opposite to the second placement surface face each other with the current line interposed therebetween.

9. The current sensor according to claim 8,
wherein directions of the first main sensitivity axis and the first sub-sensitivity axis are substantially a mirror-image of directions of the second main sensitivity axis and the second sub-sensitivity axis.

10. The current sensor according to claim 8,
wherein, when the first magnetic sensor and the second magnetic sensor are viewed from respective front-surface sides thereof, an angle defined from a direction of the first main sensitivity axis to a direction of the first sub-sensitivity axis and an angle defined from a direction of the second main sensitivity axis to a direction of the second sub-sensitivity axis are substantially the same,
wherein the first magnetic sensor is placed on the first circuit board so that a front surface thereof faces the first placement surface, and
wherein the second magnetic sensor is placed on the second circuit board so that a rear surface thereof faces the second placement surface.

11. The current sensor according to claim 10, wherein the first magnetic sensor and the second magnetic sensor have substantially the same configuration and are formed from a same wafer.

12. The current sensor according to claim 1, wherein the current sensor further includes:

a first circuit board having a first placement surface, the first magnetic sensor being placed on the first placement surface, and a second circuit board having a second placement surface, the second magnetic sensor being placed on the second placement surface, and wherein the first circuit board and the second circuit board are placed such that the first placement surface and a back surface of the second circuit board opposite to the second placement surface face each other with the current line interposed therebetween.

13. The current sensor according to claim 12, further comprising:

a spacer placed between the current line and the first magnetic sensor, or between the current line and the first circuit board, such that a distance between the current line and the first magnetic sensor and a distance between the current line and the second magnetic sensor are made substantially equal.

14. The current sensor according to claim 13, wherein the first magnetic sensor and the second magnetic sensor have substantially the same configuration and are formed from a same wafer.

15. The current sensor according to claim 12, wherein the first magnetic sensor and the second magnetic sensor have substantially the same configuration and formed from a same wafer.

16. The current sensor according to claim 1,
wherein the first magnetic sensor and the second magnetic sensor are magnetic sensors each including a magnetoresistance effect element, and
wherein the first sub-sensitivity axis and the second sub-sensitivity axis are oriented in a direction of a hard bias of the magnetoresistance effect element in the first magnetic sensor and the second magnetic sensor, respectively.

17. The current sensor according to claim 1,
wherein the first magnetic sensor and the second magnetic sensor are magnetic sensors including Hall elements with magnetic flux concentrators.

18. The current sensor according to claim 1,
wherein the first main sensitivity axis is oriented in a direction parallel to the direction of the induction magnetic field applied to the first magnetic sensor, and the second main sensitivity axis is oriented in a direction parallel to the direction of the induction magnetic field applied to the second magnetic sensor.

19. The current sensor according to claim 1,
wherein the first main sensitivity axis is oriented in a direction that is not parallel to the direction of the induction magnetic field applied to the first magnetic sensor, and the second main sensitivity axis is oriented in a direction that is not parallel to the direction of the induction magnetic field applied to the second magnetic sensor.

* * * * *